United States Patent
Cai

(10) Patent No.: US 12,332,093 B2
(45) Date of Patent: Jun. 17, 2025

(54) MAGNETIC SENSOR, MAGNETIC ENCODER, AND MANUFACTURING METHOD FOR MAGNETIC SENSOR

(71) Applicant: TDK CORPORATION, Tokyo (JP)

(72) Inventor: Yongfu Cai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 134 days.

(21) Appl. No.: 18/446,604

(22) Filed: Aug. 9, 2023

(65) Prior Publication Data
US 2024/0068846 A1    Feb. 29, 2024

(30) Foreign Application Priority Data
Aug. 22, 2022  (JP) .................. 2022-131772

(51) Int. Cl.
G01D 5/244 (2006.01)
G01D 5/245 (2006.01)

(52) U.S. Cl.
CPC ......... *G01D 5/24428* (2013.01); *G01D 5/245* (2013.01)

(58) Field of Classification Search
CPC ........... G01R 33/00; G01R 33/0005; G01R 33/0023–0041; G01R 33/09–098; G01D 5/12; G01D 5/14; G01D 5/16; G01D 5/244; G01D 5/245; G01D 5/24428
See application file for complete search history.

(56) References Cited

U.S. PATENT DOCUMENTS

| | | | |
|---|---|---|---|
| 8,232,795 B2* | 7/2012 | Saruki ............... | G01D 3/036 324/207.21 |
| 2013/0099783 A1* | 4/2013 | Kubik ............... | G01R 33/0005 324/252 |
| 2014/0035571 A1* | 2/2014 | Ausserlechner ..... | G01R 33/096 324/252 |

FOREIGN PATENT DOCUMENTS

EP       2 267 413 A1    12/2010
WO    2009/031558 A1    3/2009

* cited by examiner

*Primary Examiner* — Huy Q Phan
*Assistant Examiner* — David B Frederiksen
(74) *Attorney, Agent, or Firm* — Oliff PLC

(57) ABSTRACT

A magnetic sensor includes a bridge circuit including a first arm and a second arm, a first substrate, and a second substrate. The first arm is provided on the first substrate. The second arm is provided on the second substrate. The first arm includes a first resistor and a second resistor connected in series. The second arm includes a third resistor and a fourth resistor connected in series. The second substrate is located at a position away from the first substrate so that a phase of a resistance of the second arm when a target magnetic field changes periodically is different from that of a resistance of the first arm when the target magnetic field change periodically.

16 Claims, 16 Drawing Sheets

MAGNETIC SENSOR, MAGNETIC ENCODER, AND MANUFACTURING METHOD FOR MAGNETIC SENSOR

CROSS REFERENCE TO RELATED APPLICATIONS

This application claims the benefit of Japanese Priority Patent Application No. 2022-131772 filed on Aug. 22, 2022, the entire contents of which are incorporated herein by reference.

BACKGROUND

The present technology relates to a magnetic sensor, a magnetic encoder, and a manufacturing method for the magnetic sensor.

A magnetic encoder using a magnetic sensor is used to detect the position of a movable object whose position changes in a predetermined direction. The predetermined direction is a linear direction or a rotational direction. The magnetic encoder used to detect the position of the movable object is configured so that the position of a magnetic field generator, such as a magnetic scale, relative to the magnetic sensor changes within a predetermined range depending on the change in the position of the movable object.

As the position of the magnetic field generator relative to the magnetic sensor changes, the strength of a component of a target magnetic field, which is generated by the magnetic field generator and applied to the magnetic sensor, in one direction changes. For example, the magnetic sensor detects the strength of the component of the target magnetic field in one direction, and generates two detection signals that correspond to the strength of the component in the one direction and have respective difference phases. The magnetic encoder generates a detection value having a correspondence with the position of the magnetic field generator relative to the magnetic sensor on the basis of the two detection signals.

A magnetic sensor including a plurality of magnetoresistive elements is used as the magnetic sensor for the magnetic encoder. For example, WO 2009/031558 and EP 2267413 A1 disclose a magnetic sensor in which a plurality of giant magnetoresistive (GMR) elements are arranged as the magnetoresistive elements in a direction of relative movement between a magnet and the magnetic sensor and a direction orthogonal to the direction of relative movement.

In particular, in the magnetic sensor disclosed in EP 2267413 A1, the plurality of GMR elements constitute a bridge circuit for a phase A and a bridge circuit for a phase B. In this magnetic sensor, the plurality of GMR elements are arranged at a center-to-center distance of $\lambda$, $\lambda/2$, or $\lambda/4$ in the direction of relative movement, where $\lambda$ is the center-to-center distance (pitch) of an N pole and an S pole of the magnet. Output waveforms having a phase shift corresponding to $\lambda/2$ are obtained from the bridge circuit for the phase A and the bridge circuit for the phase B.

In the course of study by the inventor of this application, it has been found that the detection signals can cause second-order harmonic components depending on the configuration of the magnetic encoder. To reduce an error in the detection value, the second-order harmonic components are preferably reduced.

In general, a magnetic encoder is completed by combining a magnetic sensor and a magnetic field generator separately manufactured. To reduce an error in the detection value, an error due to manufacturing variations such as variations in the layout of each of the magnetic sensor and the magnetic field generator is preferably reduced.

SUMMARY

A magnetic sensor according to one embodiment of the technology includes a bridge circuit including a plurality of arms, a power supply port, a ground port, a first output port, a first substrate, and a second substrate. Each of the plurality of arms includes a plurality of magnetoresistive elements and is configured to change in resistance with a periodic change in a target magnetic field. The plurality of arms include a first arm provided on the first substrate and a second arm provided on the second substrate. The first arm is provided between the ground port and the first output port in circuit configuration. The second arm is provided between the power supply port and the first output port in the circuit configuration. The first arm includes a first resistor and a second resistor connected in series. The second arm includes a third resistor and a fourth resistor connected in series.

Each of the plurality of magnetoresistive elements includes a magnetization pinned layer having a first magnetization whose direction is fixed, a free layer having a second magnetization whose direction is variable, and a gap layer located between the magnetization pinned layer and the free layer. The first magnetization of the magnetization pinned layer in the first resistor includes a component in a first magnetization direction. The first magnetization of the magnetization pinned layer in the second resistor includes a component in a second magnetization direction opposite to the first magnetization direction. The first magnetization of the magnetization pinned layer in the third resistor includes a component in a third magnetization direction. The first magnetization of the magnetization pinned layer in the fourth resistor includes a component in a fourth magnetization direction opposite to the third magnetization direction.

The first resistor and the second resistor are located so that the second magnetization of the free layer in the first resistor includes a component in the first magnetization direction and the second magnetization of the free layer in the second resistor includes a component in the second magnetization direction at a predetermined timing when the target magnetic field changes periodically. The third resistor and the fourth resistor are located so that the second magnetization of the free layer in the third resistor includes a component in the fourth magnetization direction and the second magnetization of the free layer in the fourth resistor includes a component in the third magnetization direction at the predetermined timing. The second substrate is located at a position away from the first substrate so that a phase of a resistance of the second arm when the target magnetic field changes periodically is different from a phase of a resistance of the first arm when the target magnetic field changes periodically.

A magnetic encoder according to one embodiment of the technology includes the magnetic sensor according to one embodiment of the technology and a magnetic field generator that generates the target magnetic field. The magnetic sensor and the magnetic field generator are configured so that the target magnetic field changes periodically when at least one of the magnetic sensor and the magnetic field generator operates.

A manufacturing method for a magnetic sensor according to one embodiment of the technology includes forming a plurality of magnetoresistive elements. The forming the plurality of magnetoresistive elements includes forming a plurality of initial magnetoresistive elements each including an initial magnetization pinned layer to later become the magnetization pinned layer, the free layer, and the gap layer, and fixing the first magnetization direction of the initial magnetization pinned layer by using laser light and an external magnetic field.

In the magnetic sensor and the magnetic encoder according to one embodiment of the technology, the first arm is provided on the first substrate and includes the first and second resistors configured as described above. The second arm is provided on the second substrate and includes the third and fourth resistors configured as described above. The second substrate is located at a position away from the first substrate so that the phase of the resistance of the second arm when the target magnetic field changes periodically is different from the phase of the resistance of the first arm when the target magnetic field changes periodically. According to one embodiment of the technology, an error due to a second-order harmonic component and an error due to manufacturing variations can thus be reduced.

Other and further objects, features and advantages of the present technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
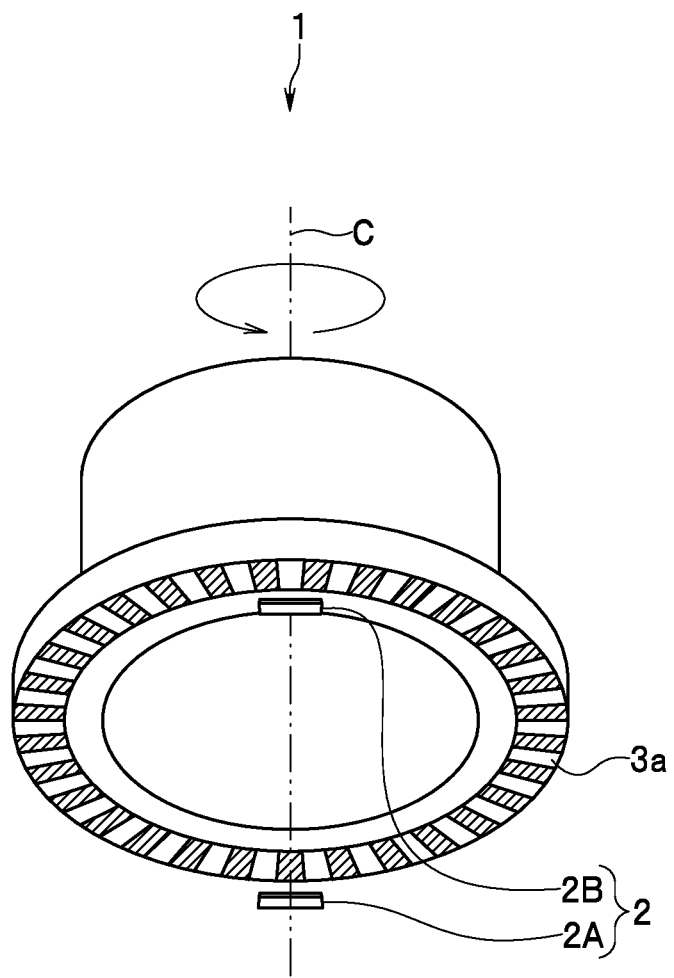
FIG. 1 is a perspective view showing a magnetic encoder according to a first example embodiment of the technology.

An object of the technology is to provide a magnetic sensor and a magnetic encoder that can reduce an error due to a second-order harmonic component and an error due to manufacturing variations.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
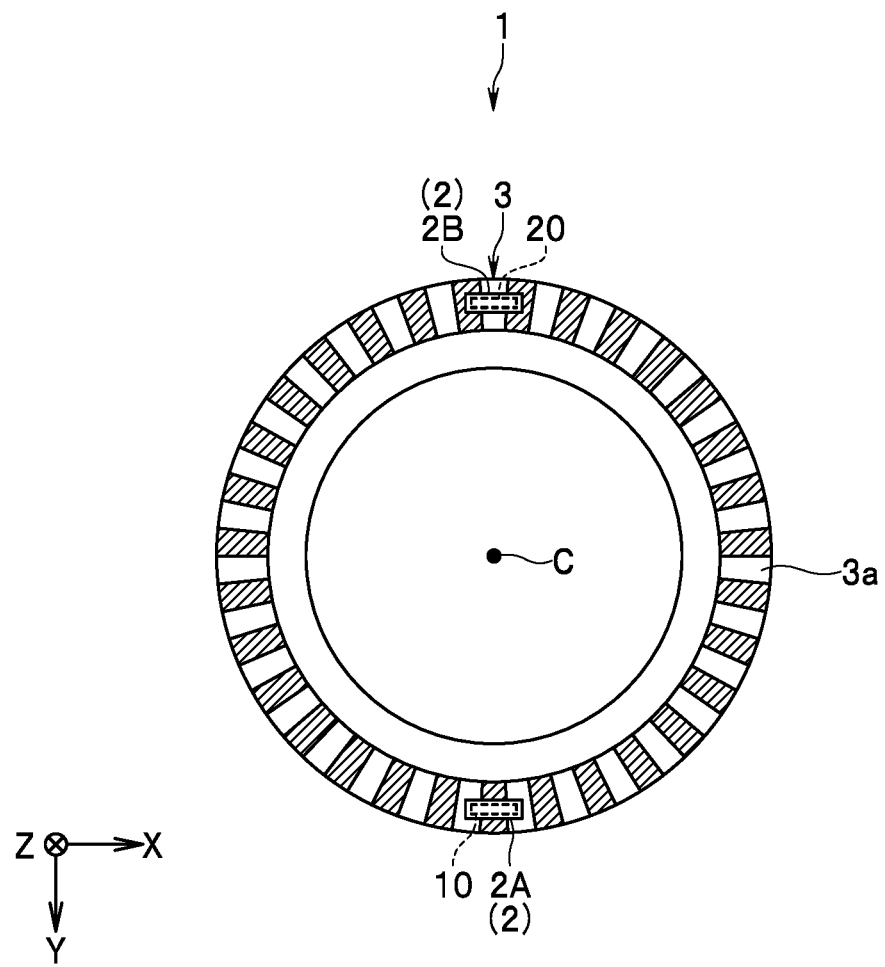
FIG. 2 is a plan view showing the magnetic encoder according to the first example embodiment of the technology.

A schematic configuration of a magnetic encoder according to a first example embodiment of the technology will initially be described with reference to FIGS. 1 and 2. FIG. 1 is a perspective view showing a magnetic encoder 1. FIG. 2 is a plan view showing the magnetic encoder 1. The magnetic encoder 1 according to the present example embodiment includes a magnetic sensor 2 according to the present example embodiment and a magnetic field generator 3.

The magnetic field generator 3 generates a target magnetic field that is a magnetic field for position detection and a magnetic field for the magnetic sensor 2 to detect (magnetic field to be detected). The target magnetic field includes a magnetic field component in a direction parallel to an imaginary straight line (hereinafter, also referred to as a magnetic field component in one direction). The magnetic sensor 2 and the magnetic field generator 3 are configured such that the strength of the magnetic field component in a reference position changes when at least one of the magnetic sensor 2 and the magnetic field generator 3 operates. The reference position may be a position in which the magnetic sensor 2 is located. The magnetic sensor 2 detects the target magnetic field including the foregoing magnetic field component, and generates at least one detection signal corresponding to the strength of the magnetic field component.

In particular, in the present example embodiment, the magnetic field generator 3 is a magnetic scale (rotation scale) including a plurality of pairs of N and S poles alternately arranged around the rotation axis C. The magnetic field generator 3 includes an end surface 3a located at an end in one direction parallel to the rotation axis C. The plurality of pairs of N and S poles are provided on the end surface 3a. In FIGS. 1 and 2, for ease of understanding, the N pole is shown with hatching. The number of pairs of N and S poles may be an odd number or an even number. In the example shown in FIGS. 1 and 2, the number of pairs of N and S poles is 31 (odd number).

As the magnetic field generator 3 rotates about the rotation axis C, the target magnetic field changes periodically. As the target magnetic field changes periodically, the strength of the magnetic field component at the reference position changes periodically.

The magnetic sensor 2 includes a first substrate 10 and a second substrate 20. Each of the first and second substrates 10 and 20 is provided with a plurality of magnetic detection elements (hereinafter, referred to as MR elements). The portion constituted by the first substrate 10 and the plurality of MR elements will hereinafter be referred to as a first sensor portion 2A. The portion constituted by the second substrate 20 and the plurality of MR elements will be referred to as a second sensor portion 2B. The first sensor portion 2A and the second sensor portion 2B may be physically separate packages. Each of the first and second sensor portions 2A and 2B may include a plurality of leads electrically connected to the plurality of MR elements.

The first sensor portion 2A and the second sensor portion 2B are opposed to the end surface 3a of the magnetic field generator 3. The strength of the magnetic field component in the one direction at the position where the first sensor portion 2A is located and the strength of the magnetic field component in the one direction at the position where the second sensor portion 2B is located change with the rotation of the magnetic field generator 3.

The numbers of N poles and S poles will be denoted by M. In the present example embodiment, M is an odd number. The second substrate 20 (second sensor portion 2B) is located at a position (180+n×360/M)° rotated from the first substrate 10 (first sensor portion 2A) about the rotation axis C, where n is an integer. FIGS. 1 and 2 show an example where M is 31 and n is 0. In this example, the second substrate 20 (second sensor portion 2B) is located at a position 180° rotated from the first substrate 10 (first sensor portion 2A) about the rotation axis C.

Now, we define X, Y, and Z directions as shown in FIG. 2. In the present example embodiment, two directions orthogonal to the rotation axis C will be defined as an X direction and a Y direction. A direction parallel to the rotation axis C and directed from the first sensor portion 2A or the second sensor portion 2B to the magnetic field generator 3 will be defined as a Z direction. In FIG. 2, the Z direction is shown as a direction from the near side to the far side of FIG. 2. The direction from the rotation axis C to the first sensor portion 2A will be referred to as the Y direction. The opposite directions to the X, Y, and Z directions will be referred to as −X, −Y, and −Z directions, respectively. The expression "viewed in the Z direction" means that a target is viewed from a position away from the target in the Z direction.

The first and second sensor portions 2A and 2B may be located at the same position or respective different positions in a direction parallel to the Z direction.

Now, assume a first imaginary plane intersecting with the first substrate 10 and being orthogonal to the rotation axis C. The plurality of MR elements provided on the first substrate 10 are configured so that the plurality of MR elements can detect the strength of a magnetic field component in a tangential direction to a first imaginary circle about the rotation axis C and within the first imaginary plane intersecting with the first substrate 10 (in a direction orthogonal to the rotation axis C). In particular, in the present example embodiment, the foregoing tangential direction is a direction parallel to the X direction. The strength of the foregoing magnetic field component changes periodically with the rotation of the magnetic field generator 3.

Assume also a second imaginary plane intersecting with the second substrate 20 and being orthogonal to the rotation axis C. The plurality of MR elements provided on the second substrate 20 are configured so that the plurality of MR elements can detect the strength of a magnetic field component in a tangential direction to a second imaginary circle about the rotation axis C and within the second imaginary plane intersecting with the second substrate 20 (in a direction orthogonal to the rotation axis C). In particular, in the present example embodiment, the foregoing tangential direction is a direction parallel to the X direction. The strength of the foregoing magnetic field component changes periodically with the rotation of the magnetic field generator 3.

Figure 3:
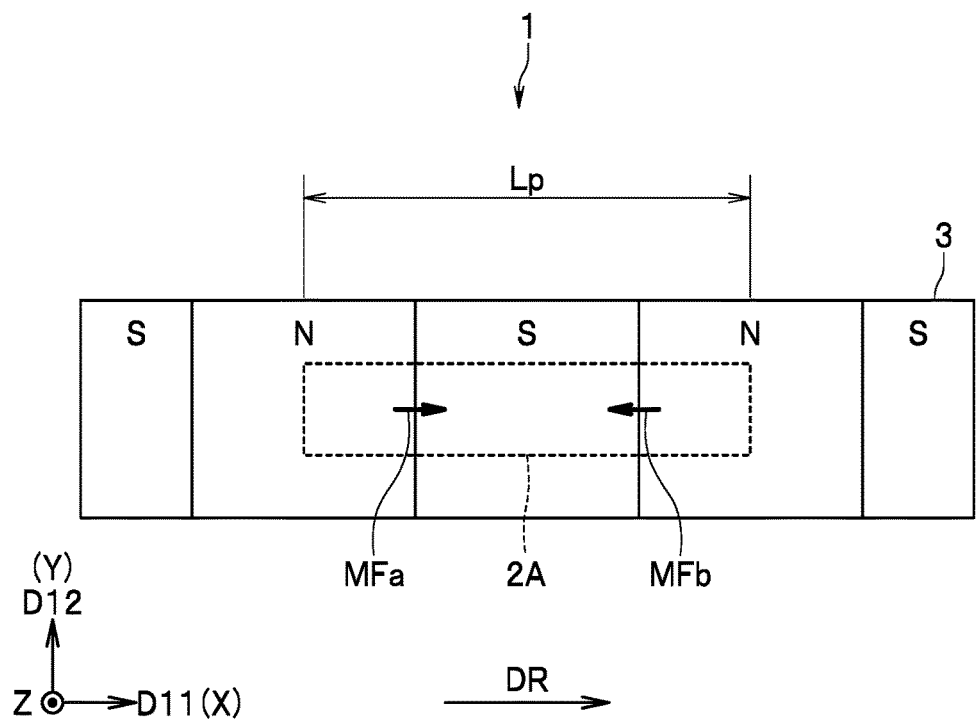
FIG. 3 is a plan view showing a first sensor portion of a magnetic sensor and a magnetic field generator according to the first example embodiment of the technology.
Figure 4:
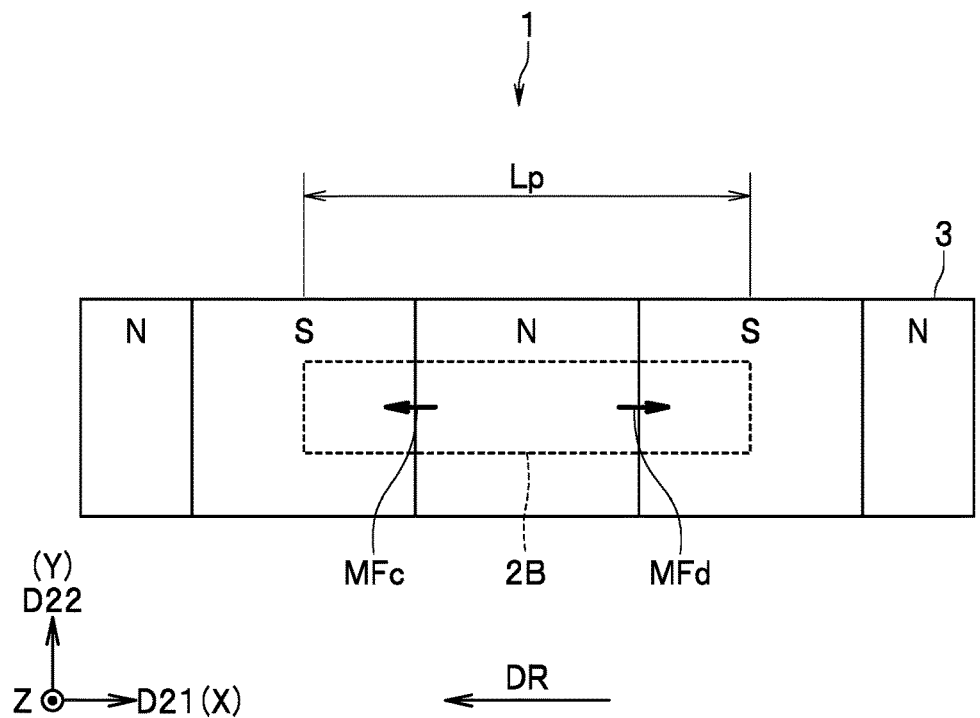
FIG. 4 is a plan view showing a second sensor portion of the magnetic sensor and the magnetic field generator according to the first example embodiment of the technology.

Next, a magnetic pole pitch, a first coordinate system, and a second coordinate system will be described with reference to FIGS. 3 and 4. FIG. 3 is a plan view showing the first sensor portion 2A and the magnetic field generator 3. FIG. 4 is a plan view showing the second sensor portion 2B and the magnetic field generator 3. As shown in FIGS. 3 and 4, a distance between two N poles adjoining in the rotational direction of the magnetic field generator 3, in other words, a center-to-center distance between the two N poles adjoining via one S pole will be referred to as a magnetic pole pitch. The size of the magnetic pole pitch will be denoted by the symbol Lp. A center-to-center distance between two S poles adjoining via one N pole is equal to the magnetic pole pitch Lp.

The first coordinate system is a coordinate system with reference to the first sensor portion 2A, and defined by a D11 direction and a D12 direction orthogonal to the Z direction. The D11 direction is a direction parallel to the tangential direction to the first imaginary circle. FIG. 3 shows an example of orientation of the first sensor portion 2A. In this example, the D11 direction agrees with the X direction. In this example, the D12 direction is a direction from the rotation axis C (see FIGS. 1 and 2) to the first sensor portion 2A and agrees with the Y direction. A direction opposite to the D11 direction will be referred to as a −D11 direction, and a direction opposite to the D12 direction as a −D12 direction.

The directions of magnetic field components detected by the plurality of MR elements provided on the first substrate 10 are directions parallel to the D11 direction. FIG. 3 shows the directions of magnetic field components MFa and MFb detected by two MR elements located at positions away from each other in the D11 direction. At the timing shown in FIG. 3, the direction of the magnetic field component MFa is the same as the D11 direction, and the direction of the magnetic field component MFb is the same as the −D11 direction.

The second coordinate system is a coordinate system with reference to the second sensor portion 2B, and defined by a D21 direction and a D22 direction orthogonal to the Z direction. The D21 direction is a direction parallel to the tangential direction to the second imaginary circle. FIG. 4 shows an example of orientation of the second sensor portion 2B. In this example, the D21 direction agrees with the X direction. In this example, the D22 direction is a direction from the second sensor portion 2B to the rotation axis C (see FIGS. 1 and 2), and agrees with the Y direction. A direction opposite to the D21 direction will be referred to as a −D21 direction, and a direction opposite to the D22 direction as a −D22 direction.

The directions of magnetic field components detected by the plurality of MR elements provided on the second substrate 20 are directions parallel to the D21 direction. FIG. 4 shows the directions of magnetic field components MFc and MFd detected by two MR elements located at positions away from each other in the D21 direction. At the timing shown in FIG. 4, the direction of the magnetic field component MFc is the same as the −D21 direction, and the direction of the magnetic field component MFd is the same as the D21 direction.

A definition of a reference direction DR used in the first and second coordinate systems in common will now be described. The reference direction DR is a direction having a correspondence with the direction of movement of the magnetic field generator 3 relative to the magnetic sensor 2. In particular, in the present example embodiment, the reference direction DR has a correspondence with the direction of movement of the N and S poles relative to each of the first and second sensor portions 2A and 2B. For the sake of convenience, the foregoing direction of relative movement is defined as a linear direction. In the present example embodiment, the reference direction DR is the same as each of the D11 and −D21 directions. As seen from each of the first and second sensor portions 2A and 2B, the N and S poles move in the reference direction DR or a direction opposite to the reference direction DR.

Figure 5:
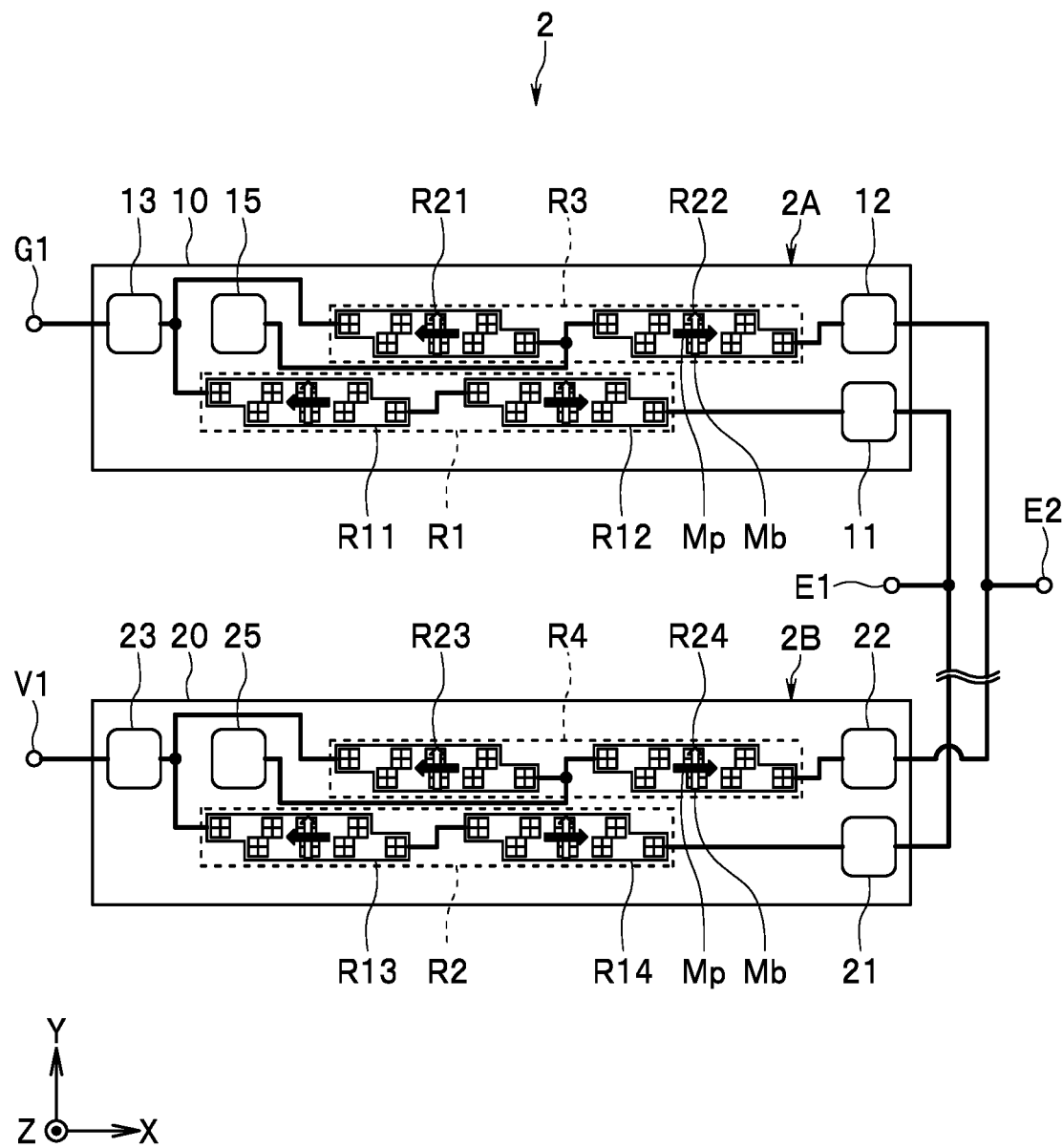
FIG. 5 is a plan view showing the magnetic sensor of the first example embodiment of the technology.
Figure 6:
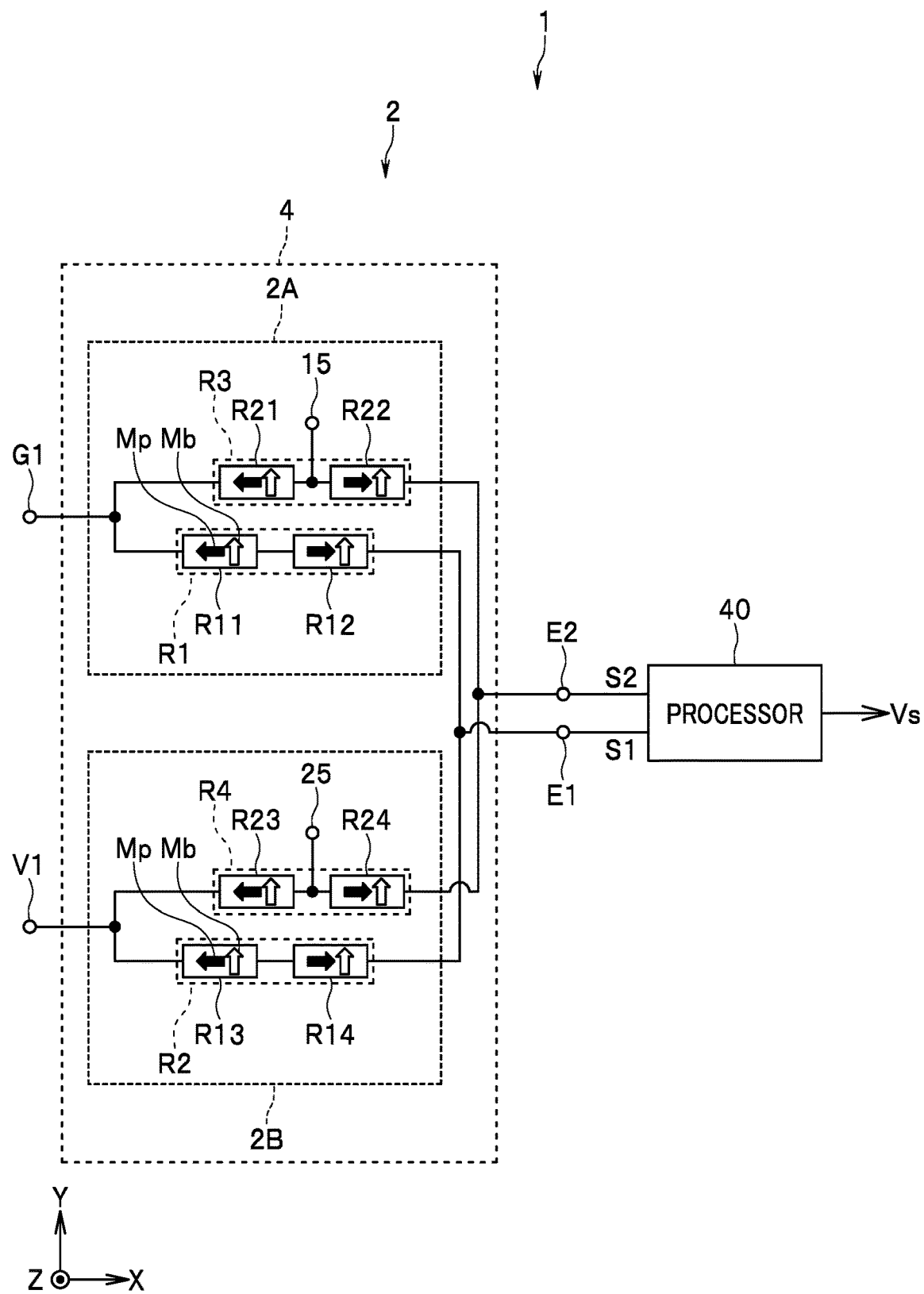
FIG. 6 is a circuit diagram showing the configuration of the magnetic sensor of the first example embodiment of the technology.

Next, the magnetic sensor 2 will be described in detail with reference to FIGS. 5 and 6. FIG. 5 is a plan view showing the magnetic sensor 2. FIG. 6 is a circuit diagram showing a configuration of the magnetic sensor 2. As shown in FIG. 6, the magnetic encoder 1 further includes a processor 40. The processor 40 generates a detection value Vs having a correspondence with the position of the magnetic sensor 2 or the magnetic field generator 3 based on at least one detection signal corresponding to the strength of a magnetic field component, generated by the magnetic sensor 2. The processor 40 can be implemented by an application specific integrated circuit (ASIC) or a microcomputer, for example.

The magnetic sensor 2 further includes a bridge circuit 4, a power supply port V1, a ground port G1, a first output port E1, and a second output port E2. The bridge circuit 4 is electrically connected to the power supply port V1, the ground port G1, the first output port E1, and the second output port E2. The first and second output ports E1 and E2 are electrically connected to the processor 40.

The bridge circuit 4 includes a plurality of arms. Each of the plurality of arms includes a plurality of MR elements and is configured to change in resistance with a periodic change in the target magnetic field. Each of the plurality of arms is configured to have sensitivity to a magnetic field component in the tangential direction to the first imaginary circle or a magnetic field component in the tangential direction to the second imaginary circle but not to an external magnetic field whose strength and direction are the same regardless of position. Such an external magnetic field will hereinafter be referred to as a uniform external magnetic field.

In the present example embodiment, the bridge circuit 4 includes four arms R1, R2, R3, and R4 as the plurality of arms. The arms R1, R2, R3, and R4 correspond to a "first arm", a "second arm", a "third arm", and a "fourth arm" of the technology, respectively. The arm R1 is provided between the ground port G1 and the first output port E1 in a circuit configuration. The arm R2 is provided between the power supply port V1 and the first output port E1 in the circuit configuration. The arm R3 is provided between the ground port G1 and the second output port E2 in the circuit configuration. The arm R4 is provided between the power supply port V1 and the second output port E2 in the circuit configuration. Note that, in this application, the expression "in circuit configuration" is used to indicate a layout in a circuit diagram and not a layout in a physical configuration.

The arms R1 and R3 are provided on the first substrate 10. The first substrate 10 includes pads 11, 12, and 13. One end of the arm R1 is electrically connected to the pad 11. One end of the arm R3 is electrically connected to the pad 12. The other ends of the arms R1 and R3 are electrically connected to the pad 13.

The arms R2 and R4 are provided on the second substrate 20. The second substrate 20 includes pads 21, 22, and 23. One end of the arm R2 is electrically connected to the pad 21. One end of the arm R4 is electrically connected to the pad 22. The other ends of the arms R2 and R4 are electrically connected to the pad 23.

The pads 11 and 21 are electrically connected to each other by a first line. The first line is electrically connected to the first output port E1. The pads 12 and 22 are electrically connected to each other by a second line. The second line is electrically connected to the second output port E2. The pad 13 is electrically connected to the ground port G1. The pad 23 is electrically connected to the power supply port V1.

The magnetic sensor 2 may be driven by a constant voltage or driven by a constant current. In the case where the magnetic sensor 2 is driven by a constant voltage, a voltage of predetermined magnitude is applied to the power supply port V1. In the case where the magnetic sensor 2 is driven by a constant current, a current of predetermined magnitude is supplied to the power supply port V1.

The magnetic sensor 2 generates a signal having a correspondence with the potential at the first output port E1 as a first detection signal S1, and generates a signal having a correspondence with the potential at the second output port E2 as a second detection signal S2. The processor 40 generates the detection value Vs on the basis of the first and second detection signals S1 and S2. At least one of the magnetic sensor 2 and the processor 40 may be configured to be able to correct the amplitude, phase, and offset of each of the first and second detection signals S1 and S2.

Each of the arms R1 to R4 includes two resistors connected in series. Each of the two resistors includes a plurality of MR elements and is configured to change in resistance with the strength of the magnetic field component to be detected. Ideally, in each of the arms R1 to R4, the two resistances are configured so that the resistances of the two resistors change in the same phase with a periodical change in the strength of the magnetic field component to be detected, and the resistances of the two resistors change in opposite phases with a periodic change in the strength or direction of the uniform external magnetic field.

In the present example embodiment, the arm R1 includes two resistors R11 and R12. The arm R2 includes two resistors R13 and R14. The arm R3 includes two resistors R21 and R22. The arm R4 includes two resistors R23 and R24. In particular, in the present example embodiment, the resistors R11, R12, R13, R14, R21, R22, R23, and R24 correspond to a "first resistor", a "second resistor", a "third resistor", a "fourth resistor", a "fifth resistor", a "sixth resistor", a "seventh resistor", and an "eighth resistor" of the technology, respectively.

One end of the resistor R11 is electrically connected to the pad 13. The other end of the resistor R11 is electrically connected to one end of the resistor R12. The other end of the resistor R12 is electrically connected the pad 11.

One end of the resistor R13 is electrically connected to the pad 23. The other end of the resistor R13 is electrically connected to one end of the resistor R14. The other end of the resistor R14 is electrically connected to the pad 21.

One end of the resistor R21 is electrically connected to the pad 13. The other end of the resistor R21 is electrically connected to one end of the resistor R22. The other end of the resistor R22 is electrically connected to the pad 12.

One end of the resistor R23 is electrically connected to the pad 23. The other end of the resistor R23 is electrically connected to one end of the resistor R24. The other end of the resistor R24 is electrically connected to the pad 22.

The first substrate 10 further includes a sub-pad 15. The sub-pad 15 is electrically connected to between one end and the other end of the arm R3. In particular, in the present example embodiment, the sub-pad 15 is electrically connected to the connection point of the resistors R21 and R22.

The second substrate 20 further includes a sub-pad 25. The sub-pad 25 is electrically connected to between one end and the other end of the arm R4. In particular, in the present example embodiment, the sub-pad 25 is electrically connected to the connection point of the resistors R23 and R24.

The resistance of the arm R1 and that of the arm R2 change in respective different phases with a periodical change in the target magnetic field. The resistance of the arm R3 and that of the arm R4 change in respective different phases with a periodical change in the target magnetic field. In the present example embodiment, the second substrate 20 is located at a position away from the first substrate 10 so that the phase of the resistance of the arm R2 (phase of the resistance of the arm R4) when the target magnetic field changes periodically is different from the phase of the resistance of the arm R1 (phase of the resistance of the arm R3) when the target magnetic field changes periodically.

A phase difference between the resistances of the arms R1 and R2 and a phase difference between the resistances of the arms R3 and R4 may both be 180°. The phase differences can be set to 180° by locating the second substrate 20 at a position (180+n×360/M)° rotated from the first substrate 10 about the rotation axis C as described above. The phase differences are not limited to 180°, and may be in the range of 175° to 185°, for example.

Figure 7:
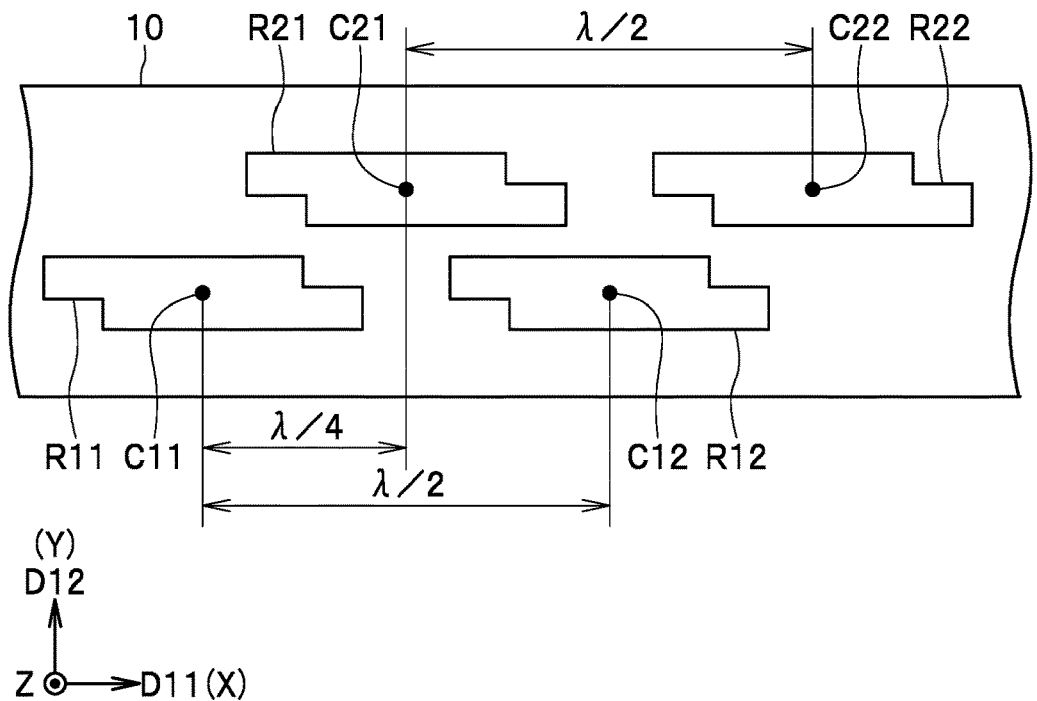
FIG. 7 is an explanatory diagram for describing a layout of a plurality of resistors on a first substrate according to the first example embodiment of the technology.

Next, the layout of the resistors R11, R12, R21, and R22 on the first substrate 10 will be described with reference to FIGS. 3 and 7. FIG. 7 is an explanatory diagram for describing the layout of the resistors R11, R12, R21, and R22 on the first substrate 10. The layout of the resistors R11, R12, R21, and R22 provided on the first substrate 10 is defined by the first coordinate system described with reference to FIG. 3.

The resistance of each of the resistors R11 and R12 has a correspondence with the first detection signal S1. The resistance of each of the resistors R21 and R22 has a correspondence with the second detection signal S2. The pair of resistors R11 and R12 and the pair of resistors R21 and R22 are located at respective different positions in the direction parallel to the D11 direction so that the first detection signal S1 and the detection signal S2 have respective different phases.

In FIG. 7, a reference numeral C11 denotes a first position inside the resistor R11, a reference numeral C12 denotes a second position inside the resistor R12, a reference numeral C21 denotes a third position inside the resistor R21, and a reference numeral C22 denotes a fourth position inside the resistor R22. In particular, in the present example embodiment, the first position C11 is the center of gravity of the resistor R11 when viewed in the Z direction, the second position C12 is the center of gravity of the resistor R12 when viewed in the Z direction, the third position C21 is the center of gravity of the resistor R21 when viewed in the Z direction, and the fourth position C22 is the center of gravity of the resistor R22 when viewed in the Z direction.

Now, a design pitch $\lambda$ is defined as described below. The design pitch $\lambda$ is four times a distance between a predetermined position in the resistor R11 and a predetermined position in the resistor R21 in the direction parallel to the D11 direction. In particular, in the present example embodiment, the predetermined position in the resistor R11 is the first position C11, and the predetermined position in the resistor R21 is the third position C21.

In particular, in the present example embodiment, a distance between the first position C11 and the third position C21 in the direction parallel to the D11 direction and a distance between the second position C12 and the fourth position C22 in the direction parallel to the D11 direction are equal to each other. Therefore, the design pitch $\lambda$ can also be defined by using a pair of the resistors R12 and R22 instead of a pair of the resistors R11 and R21.

Here, assume a specific magnetic field generator including a plurality of pairs of N and S poles. When the specific magnetic field generator operates, the resistance of the pair of resistors R11 and R12 (resistance of the arm R1) and the resistance of the pair of resistors R21 and R22 (resistance of the arm R2) change periodically with a phase difference of 90°. In the specific magnetic field generator, the design pitch $\lambda$ is substantially the same as the distance between two N poles adjoining via one S pole.

The specific magnetic field generator may be the magnetic field generator 3 shown in FIG. 2. In this case, the design pitch $\lambda$ is equal to the magnetic pole pitch Lp shown in FIG. 2. Alternatively, the specific magnetic field generator may be a magnetic field generator having a magnetic pole pitch different from the magnetic pole pitch Lp of the magnetic field generator 3. In this case, the design pitch $\lambda$ has a size different from the magnetic pole pitch Lp.

The resistors R11, R12, R21, and R22 satisfy the following requirements about the physical layout. A distance between the first position C11 and the second position C12 in the direction parallel to the D11 direction is equal to an odd number of times ½ of the design pitch $\lambda$. A distance between the third position C21 and the fourth position C22 in the direction parallel to the D11 direction is equal to an odd number of times ½ of the design pitch $\lambda$. A distance between the first position C11 and the third position C21 in the direction parallel to the D11 direction is equal to $(4n-3)/4$ of the design pitch $\lambda$. Note that n is an integer of one or more.

In the present example embodiment, the second position C12 is $\lambda/2$ away from the first position C11 in the D11 direction. The fourth position C22 is $\lambda/2$ away from the third position C21 in the D11 direction. The third and fourth positions C21 and C22 are in front of the first and second positions C11 and C12 in the D12 direction.

Figure 8:
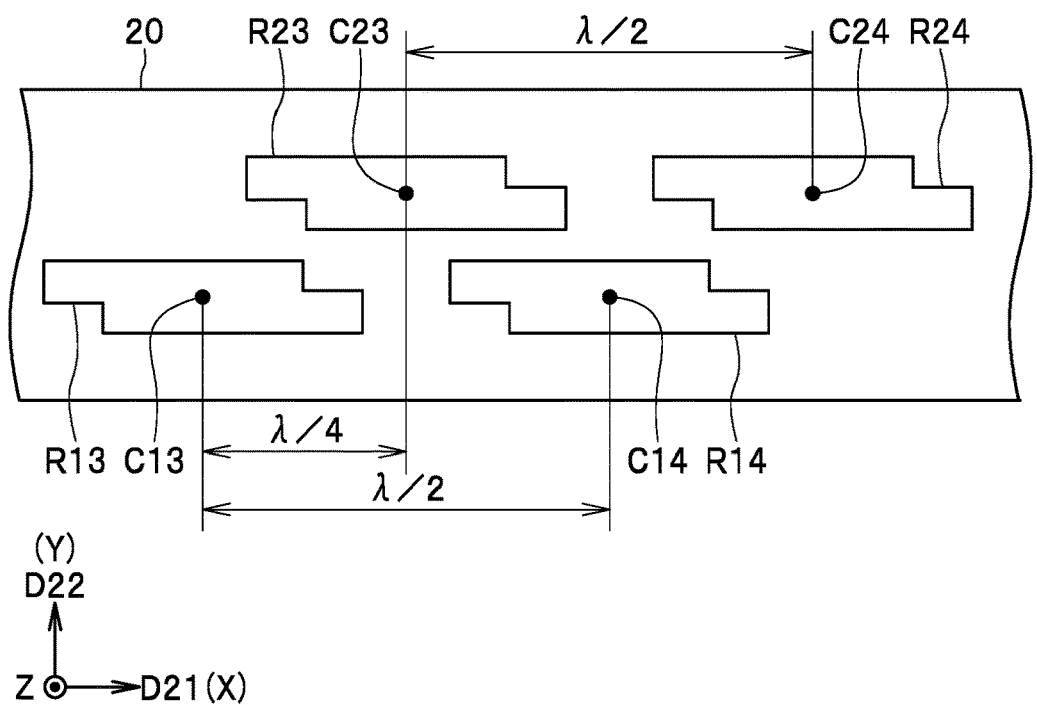
FIG. 8 is an explanatory diagram for describing a layout of a plurality of resistors on a second substrate according to the first example embodiment of the technology.

Next, the layout of the resistors R13, R14, R23, and R24 on the second substrate 20 will be described with reference to FIGS. 4 and 8. FIG. 8 is an explanatory diagram for describing the layout of the resistors R13, R14, R23, and R24 on the second substrate 20. The layout of the resistors R13, R14, R23, and R24 provided on the second substrate 20 is defined by the second coordinate system described with reference to FIG. 4.

In FIG. 8, a reference numeral C13 denotes a fifth position inside the resistor R13. A reference numeral C14 denotes a sixth position inside the resistor R14. A reference numeral C23 denotes a seventh position inside the resistor R23. A reference numeral C24 denotes an eighth position inside the resistor R24.

The physical layout rule of the resistors R13, R14, R23, and R24 on the second substrate 20 is the same as that of the resistors R11, R12, R21, and R22 on the first substrate 10. The description of the physical layout rule of the resistors R11, R12, R21, and R22 applies to the physical layout rule of the resistors R13, R14, R23, and R24 if the resistors R11, R12, R21, and R22, the first to fourth positions C11, C12, C21, and C22, the D11 direction, and the D12 direction in the description are replaced with the resistors R13, R14, R23, and R24, the fifth to eighth positions C13, C14, C23, and C24, the D21 direction, and the D22 direction, respectively.

Next, a configuration of the resistors R11 to R14, and R21 to R24 will be described. Each of the first and second detection signals S1 and S2 contains an ideal component which varies periodically with a predetermined signal period in such a manner as to trace an ideal sinusoidal curve (including sine and cosine waveforms). In the present example embodiment, the resistors R11 to R14, and R21 to R24 are configured such that the ideal component of the first detection signal S1 and the ideal component of the second detection signal S2 have respective different phases. If the specific magnetic field generator is the magnetic field generator 3, i.e., the design pitch λ is the same as the magnetic pole pitch Lp, the design pitch λ shown in FIGS. 7 and 8 is equivalent to one period of the ideal component, i.e., an electrical angle of 360°.

Each of the first and second detection signals S1 and S2 contains a plurality of harmonic components corresponding to higher-order harmonics of the ideal component aside from the ideal component. In the present example embodiment, the resistors R11 to R14, and R21 to R24 are configured to reduce the plurality of harmonic components.

In the following, the configuration of the resistors R11 to R14, and R21 to R24 will be described concretely. Initially, the configuration of the MR elements 50 will be described. In the present example embodiment, the MR elements 50 are each a spin-valve MR element. The spin-valve MR element includes a magnetization pinned layer 51, a free layer 53, and a gap layer 52 located between the magnetization pinned layer 51 and the free layer 53. The magnetization pinned layer 51 has a first magnetization whose direction is fixed. The free layer 53 has a second magnetization whose direction is variable. The magnetization pinned layer 51, the gap layer 52, and the free layer 53 are stacked in a direction parallel to the Z direction.

The spin-valve MR element may be a tunneling magnetoresistive (TMR) element or a giant magnetoresistive (GMR) element. In particular, in the present example embodiment, the MR element 50 is desirably a TMR element to reduce the dimension of the magnetic sensor 2. In the TMR element, the gap layer 52 is a tunnel barrier layer. In the GMR element, the gap layer 52 is a nonmagnetic conductive layer. The resistance of the spin-valve MR element changes with the angle that the magnetization direction of the free layer 53 forms with respect to the magnetization direction of the magnetization pinned layer 51. The resistance of the spin-valve MR element is at its minimum value when the foregoing angle is 0°, and at its maximum value when the foregoing angle is 180°.

In FIG. 5, arrows shown inside the resistors R11 to R14, and R21 to R24 indicate first magnetization directions of the magnetization pinned layers 51 in the plurality of respective MR elements 50 included in the resistors. In FIG. 5, the directions of the first magnetizations of the magnetization pinned layers 51 are indicated by the arrows denoted by the symbol Mp. In FIG. 6, the directions of the first magnetizations of the magnetization pinned layers 51 are indicated by the solid arrows.

Figure 9:
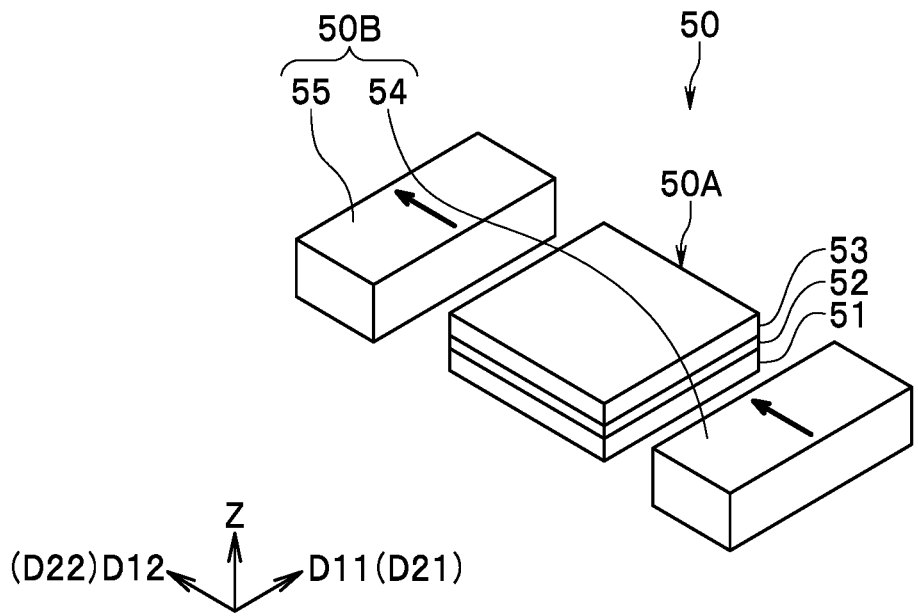
FIG. 9 is a perspective view showing a first example of a magnetoresistive element of the first example embodiment of the technology.

Now, first and second examples of an MR element 50 will be described with reference to FIGS. 9 and 10. FIG. 9 is a perspective view showing the first example of the MR element 50. In the first example, the MR element 50 includes a layered film 50A including a magnetization pinned layer 51, a gap layer 52, and a free layer 53 stacked in this order in the Z direction. The layered film 50A may have a circular planar shape, or a square or substantially square planar shape as shown in FIG. 9 when viewed in the Z direction.

The bottom surface of the layered film 50A of the MR element 50 is electrically connected to the bottom surface of the layered film 50A of another MR element 50 by a not-shown lower electrode. The top surface of the layered film 50A of the MR element 50 is electrically connected to the top surface of the layered film 50A of yet another MR element 50 by a not-shown upper electrode. In such a manner, the plurality of MR elements 50 are connected in series. It should be appreciated that the layers 51 to 53 of the layered film 50A may be stacked in the reverse order to that shown in FIG. 9.

The MR element 50 further includes a bias magnetic field generator 50B that generates a bias magnetic field to be applied to the free layer 53. The direction of the bias magnetic field is a direction intersecting with the direction of the first magnetization of the magnetization pinned layer 51. In the first example, the bias magnetic field generator 50B includes two magnets 54 and 55. If the MR element 50 is one provided on the first substrate 10, the magnets 54 and 55 are arranged in this order along the D12 direction. If the MR element 50 is one provided on the second substrate 20, the magnets 54 and 55 are arranged in this order along the D22 direction. The layered film 50A is located between the magnets 54 and 55. In particular, in the first example, the layered film 50A and the magnets 54 and 55 are located to intersect with an imaginary plane orthogonal to the Z direction.

In FIG. 9, the arrows in the magnets 54 and 55 indicate the magnetization directions of the magnets 54 and 55. In FIG. 5, the directions of the bias magnetic fields are indicated by the arrows denoted by the symbol Mb. In FIG. 6, the directions of the bias magnetic fields are indicated by the hollow arrows.

In the MR element 50 provided on the first substrate 10, the direction of the bias magnetic field is the D12 direction. The direction of the bias magnetic field will be defined with reference to the magnetic field generator 3. The direction of the bias magnetic field on the first substrate 10 is 90° rotated counterclockwise from the reference direction DR (see FIG. 3) when viewed from above the magnetic field generator 3 (viewed in the Z direction).

In the MR element 50 provided on the second substrate 20, the direction of the bias magnetic field is the D22 direction. The direction of the bias magnetic field will be defined with reference to the magnetic field generator 3. The direction of the bias magnetic field on the second substrate 20 is 90° rotated clockwise from the reference direction DR (see FIG. 4) when viewed from above the magnetic field generator 3 (viewed in the Z direction).

Figure 10:
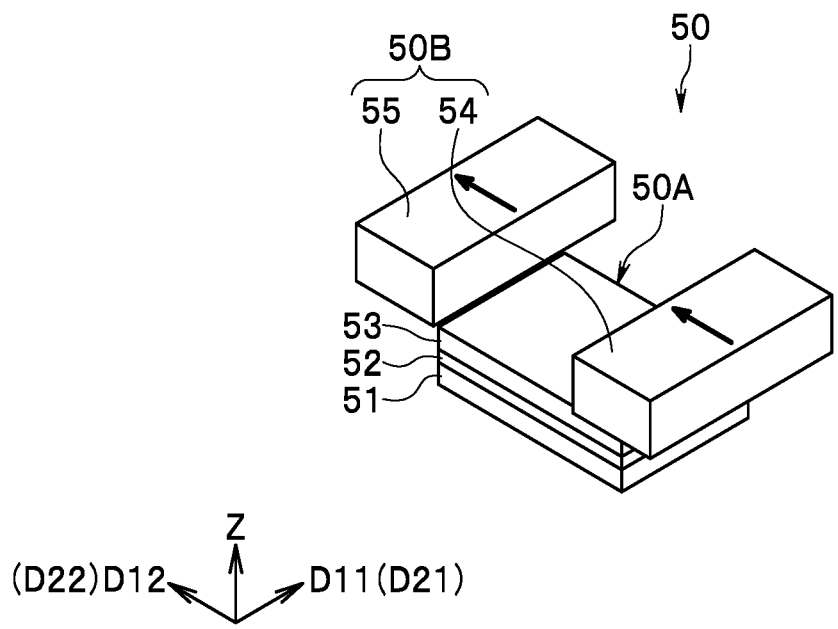
FIG. 10 is a perspective view showing a second example of the magnetoresistive element of the first example embodiment of the technology.

FIG. 10 is a perspective view showing the second example of the MR element 50. The configuration of the second example of the MR element 50 is the same as that of the first example of the MR element 50 except for the planar shape of the layered film 50A and the positions of the magnets 54 and 55. In the second example, the magnets 54 and 55 are located at positions different from that of the layered film 50A in the Z direction. In particular, in the example shown in FIG. 10, the magnets 54 and 55 are located in front of the layered film 50A in the Z direction. The planar shape of the layered film 50A when viewed in the Z direction is a rectangle long in the D12 direction (D22 direction). When viewed in the Z direction, the magnets 54 and 55 are located to overlap the layered film 50A.

The direction of the bias magnetic field and the layout of the magnets 54 and 55 are not limited to the examples shown in FIGS. 9 and 10. For example, the direction of the bias magnetic field may be any direction intersecting with the reference direction DR shown in FIGS. 3 and 4, and may be a direction tilted with respect to the D12 direction (D22 direction). For example, the angle that the direction of the bias magnetic field forms with the reference direction DR may be in the range of 85° to 95°. The magnets 54 and 55 may be located at respective different positions in the direction parallel to the D11 direction (D21 direction).

The bias magnetic field may be applied to the free layer 53 by uniaxial magnetic anisotropy such as magnetic shape anisotropy or magnetocrystalline anisotropy instead of the bias magnetic field generator 50B.

Next, the direction of the first magnetization of the magnetization pinned layer 51 in each of the resistors R11 to R14 and R21 to R24 will be described. The first magnetization of the magnetization pinned layer 51 in each of the resistors R11, R12, R21, and R22 provided on the first substrate 10 is defined by the first coordinate system described with reference to FIG. 3. The first magnetization of the magnetization pinned layer 51 in each of the resistors R11 and R21 includes a component in a first magnetization direction. The first magnetization of the magnetization pinned layer 51 in each of the resistors R12 and R22 includes a component in a second magnetization direction opposite to the first magnetization direction. In particular, in the present example embodiment, the first magnetization direction is the −D11 direction, and the second magnetization direction is the D11 direction.

The first magnetization of the magnetization pinned layer 51 in each of the resistors R13, R14, R23, and R24 provided on the second substrate 20 is defined by the second coordinate system described with reference to FIG. 4. The first magnetization of the magnetization pinned layer 51 in each of the resistors R13 and R23 includes a component in a third magnetization direction. The first magnetization of the magnetization pinned layer 51 in each of the resistors R14 and R24 includes a component in a fourth magnetization direction opposite to the third magnetization direction. In particular, in the present example embodiment, the third magnetization direction is the −D21 direction, and the fourth magnetization direction is the D21 direction.

Note that, when the first magnetization contains a component in a specific magnetization direction, the component in the specific magnetization direction may be a main component of the first magnetization. Alternatively, the first magnetization may not contain a component in a direction orthogonal to the specific magnetization direction. In the present example embodiment, when the first magnetization contains the component in the specific magnetization direction, the first magnetization direction is the specific magnetization direction or substantially the specific magnetization direction.

Next, a relationship between the layout of the resistors R11 to R14 and R21 to R24 and the directions of the second magnetizations of the free layers 53 will be described. For the sake of convenience, the following description will be given by assuming the free layer 53 in one MR element 50 representative of the plurality of MR elements 50 in each of the resistors R11 to R14 and R21 to R24. In each of the resistors R11 to R14 and R21 to R24, the direction of the second magnetization of the free layer 53 changes within a plane orthogonal to the Z direction depending on the strength of the magnetic field component for the MR element 50 to detect. As a result, the resistance of each of the resistors R11 to R14 and R21 to R24, the resistance of each of the arms R1 to R4, and the potential at each of the first and second output ports E1 and E2 change with the strength of the magnetic field component. If the strength of the magnetic field component for the MR element 50 to detect is 0, the direction of the second magnetization of the free layer 53 in the MR element 50 is the same as the direction of the bias magnetic field applied to the free layer 53.

The resistors R11 and R12 are located so that the second magnetization of the free layer 53 in the resistor R11 includes a component in the first magnetization direction and the second magnetization of the free layer 53 in the resistor R12 includes a component in the second magnetization direction at a predetermined timing when the target magnetic field changes periodically. The resistors R11 and R12 are also located so that the second magnetization of the free layer 53 in the resistor R11 includes a component in the second magnetization direction and the second magnetization of the free layer 53 in the resistor R12 includes a component in the first magnetization direction at another predetermined timing when the target magnetic field changes periodically.

Suppose, for example, that the resistors R11 and R12 are located along the D11 direction so that the MR element 50 of the resistor R11 detects the magnetic field component MFa and the MR element 50 of the resistor R12 detects the magnetic field component MFb at the timing shown in FIG. 3. Here, the second magnetization of the free layer 53 in the resistor R11 tilts from the direction of the bias magnetic field (D12 direction) to the D11 direction, and the second magnetization of the free layer 53 in the resistor R12 tilts from the direction of the bias magnetic field (D12 direction) to the −D11 direction. In such a case, the second magnetization of the free layer 53 in the resistor R11 includes a component in the D11 direction, i.e., a component in the second magnetization direction, and the second magnetization of the free layer 53 in the resistor R12 includes a component in the −D11 direction, i.e., a component in the first magnetization direction.

If the resistors R11 and R12 are located as described above, the magnetizations of the free layers 53 tilt in directions opposite to the foregoing directions at timing when the directions of the respective magnetic field components MFa and MFb are reversed from those shown in FIG. 3. In such a case, the second magnetization of the free layer 53 in the resistor R11 includes a component in the −D11 direction, i.e., a component in the first magnetization direction, and the second magnetization of the free layer 53 in the resistor R12 includes a component in the D11 direction, i.e., a component in the second magnetization direction.

Suppose that the MR element 50 of the resistor R11 is located at the first position C11 shown in FIG. 7, the MR element 50 of the resistor R12 is located at the second position C12 shown in FIG. 7, and the design pitch λ is the same as the magnetic pole pitch Lp. In such a case, the timing when the strength of the magnetic field component MFa detected by the MR element 50 of the resistor R11 becomes zero is the same as the timing when the strength of the magnetic field component MFb detected by the MR element 50 of the resistor R12 becomes zero. The timing when the direction of the second magnetization of the free layer 53 in the resistor R11 coincides with the direction of the bias magnetic field (D12 direction) is thus the same as the timing when the direction of the second magnetization of the free layer 53 in the resistor R12 coincides with the direction of the bias direction (D12 direction).

If the MR element 50 of the resistor R11 is located at the first position C11 shown in FIG. 7, the MR element 50 of the resistor R12 is located at the second position C12 shown in FIG. 7, and the design pitch λ is different from the magnetic pole pitch Lp, the timing when the magnetic field component MFa detected by the MR element 50 of the resistor R11 becomes zero is different from the timing when the magnetic field component MFb detected by the MR element 50 of the resistor R12 becomes zero. The timing when the direction of the second magnetization of the free layer 53 in the resistor R11 coincides with the direction of the bias magnetic field (D12 direction) is thus different from the timing when the direction of the second magnetization of the free layer 53 in the resistor R12 coincides with the direction of the bias magnetic field (D12 direction).

The foregoing description of the layout of the resistors R11 and R12 applies to the pair of resistors R13 and R14, the pair of resistors R21 and R22, and the pair of resistors R23 and R24 as well. The description of the layout of the resistors R11 and R12 applies to the layout of the resistors R13 and R14 if the resistors R11 and R12, the D11 direction, the D12 direction, the first magnetization direction, the second magnetization direction, the first position C11, and the second position C12 in the description are replaced with the resistors R13 and R14, the D21 direction, the D22 direction, the third magnetization direction, the fourth magnetization direction, the fifth position C13, and the sixth position C14, respectively.

The description of the layout of the resistors R11 and R12 applies to the layout of the resistors R21 and R22 if the resistors R11 and R12, the first position C11, and the second position C12 in the description are replaced with the resistors R21 and R22, the third position C21, and the fourth position C22, respectively.

The description of the layout of the resistors R11 and R12 applies to the layout of the resistors R23 and R24 if the resistors R11 and R12, the D11 direction, the D12 direction, the first magnetization direction, the second magnetization direction, the first position C11, and the second position C12 in the description are replaced with the resistors R23 and R24, the D21 direction, the D22 direction, the third magnetization direction, the fourth magnetization direction, the seventh position C23, and the eighth position C24, respectively.

The description so far has been given by assuming the free layer 53 in one MR element 50 representative of the plurality of MR elements 50 in each of the resistors R11 to R14 and R21 to R24. Actually, each of the resistors R11 to R14 and R21 to R24 includes a plurality of MR elements 50 located at respective different positions. The requirements as to the layout of the resistors R11 to R14 and R21 to R24 therefore have only to be satisfied by at least one of the plurality of MR elements 50.

Next, the layout of the plurality of MR elements 50 in each of the resistors R11 to R14, and R21 to R24 will be described. As employed herein, a set of one or more MR elements 50 will be referred to as an element group. Each of the resistors R11 to R14, and R21 to R24 includes a plurality of element groups. To reduce an error component, the plurality of element groups are located at predetermined distances from each other on the basis of the design pitch λ. In the following description, the layout of the plurality of element groups will be described with reference to predetermined positions of the element groups. An example of the predetermined position of an element group is the center of gravity of the element group when viewed in the Z direction.

Figure 11:
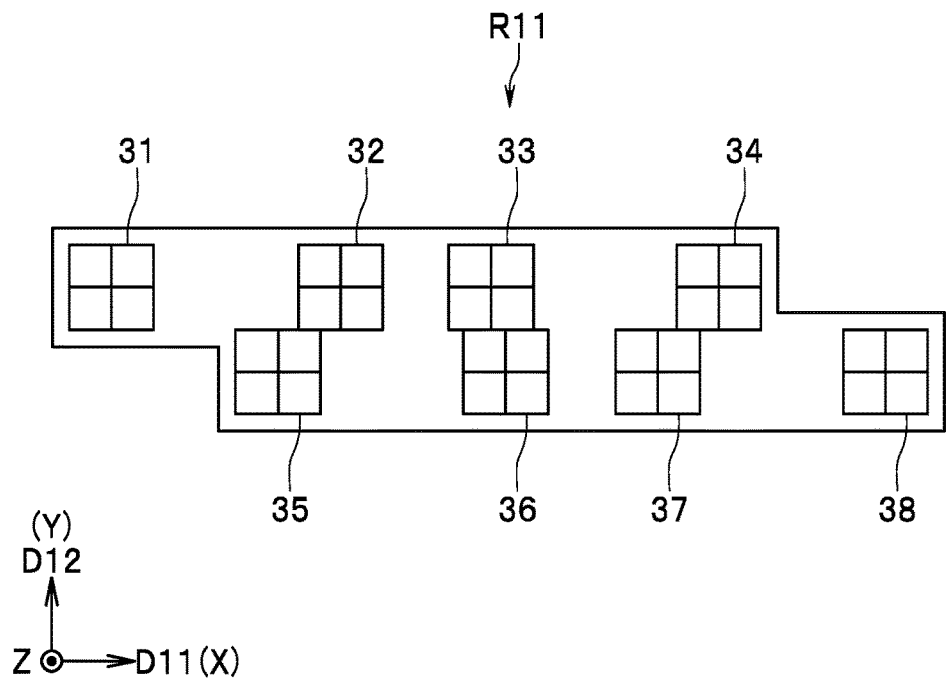
FIG. 11 is a plan view showing a resistor according to the first example embodiment of the technology.

FIG. 11 is a plan view showing the resistor R11. As shown in FIG. 11, the resistor R11 includes eight element groups 31, 32, 33, 34, 35, 36, 37, and 38. Each of the element groups 31 to 38 is divided into four sections. Each section includes one or more MR elements 50. In other words, each element group includes four or more MR elements 50. The plurality of MR elements 50 may be connected in series within the element group. In such a case, the plurality of element groups may be connected in series. Alternatively, the plurality of MR elements 50 may be connected in series regardless of the element groups.

In FIG. 11, the element groups 31 to 38 are located to reduce a harmonic component corresponding to a third harmonic (third-order harmonic) of the ideal component, a harmonic component corresponding to a fifth harmonic (fifth-order harmonic) of the ideal component, and a harmonic component corresponding to a seventh harmonic (seventh-order harmonic) of the ideal component. As shown in FIG. 11, the element groups 31 to 34 are arranged in the D11 direction. The element group 32 is located at a position λ/10 away from the element group 31 in the D11 direction. The element group 33 is located at a position λ/6 away from the element group 31 in the D11 direction. The element group 34 is located at a position λ/10+λ/6 away from the element group 31 in the D11 direction (at a position λ/6 away from the element group 32 in the D11 direction).

As shown in FIG. 11, the element groups 35 to 38 are arranged in the D11 direction in front of the element groups 31 to 34 in the −D12 direction. The element group 35 is located at a position λ/14 away from the element group 31 in the D11 direction. The element group 36 is located at a position λ/14+λ/10 away from the element group 31 in the D11 direction (at a position λ/14 away from the element group 32 in the D11 direction). The element group 37 is located at a position λ/14+λ/6 away from the element group 31 in the D11 direction (at a position λ/14 away from the element group 33 in the D11 direction). The element group 38 is located at a position λ/14+λ/10+λ/6 away from the element group 31 in the D11 direction (at a position λ/14 away from the element group 34 in the D11 direction).

The layout of the plurality of element groups for reducing the plurality of harmonic components is not limited to the example shown in FIG. 11. Suppose now that k and m are integers that are greater than or equal to 1 and different from each other. For example, to reduce a harmonic component corresponding to a (2 k+1)th-order harmonic, a first element group is located at a position $\lambda(4 k+2)$ away from a second element group in the D11 direction. Further, to reduce an error component corresponding to a (2 m+1)th-order harmonic, a third element group is located at a position $\lambda(4 m+2)$ away from the first element group in the D11 direction, and a fourth element group is located at a position $\lambda(4 m+2)$ away from the second element group in the D11 direction. In such a manner, to reduce harmonic components corresponding to a plurality of harmonics, each of a plurality of element groups for reducing an error component corresponding to one harmonic is located at a position a predetermined distance based on the design pitch $\lambda$ away from each of a plurality of element groups for reducing an error component corresponding to another harmonic in the D11 direction.

In the present example embodiment, the configuration and layout of the plurality of element groups in each of the resistors R12 to R14, and R21 to R24 are the same as those of the plurality of element groups in the resistor R11. Specifically, each of the resistors R12 to R14, and R21 to R24 also includes the eight element groups 31 to 38 having the configuration and positional relationship shown in FIG. 11. The description of the positional relationship between the eight element groups 31 to 38 in the resistor R11 applies to the positional relationship between the eight element groups 31 to 38 in each of the resistors R13, R14, R23, and R24 if the D11 direction and the D12 direction in the description are replaced with the D21 direction and the D22 direction, respectively.

The element group 31 of the resistor R12 is located at a position $\lambda/2$ in the D11 direction away from the element group 31 of the resistor R11. The element group 31 of the resistor R22 is located at a position $\lambda/2$ in the D11 direction away from the element group 31 of the resistor R21. The element group 31 of the resistor R21 is located at a position $\lambda/4$ in the D11 direction away from the element group 31 of the resistor R11.

The element group 31 of the resistor R14 is located at a position $\lambda/2$ in the D21 direction away from the element group 31 of the resistor R13. The element group 31 of the resistor R24 is located at a position $\lambda/2$ in the D21 direction away from the element group 31 of the resistor R23. The element group 31 of the resistor R23 is located at a position $\lambda/4$ in the D21 direction away from the element group 31 of the resistor R13.

The configuration of the resistors R11 to R14, and R21 to R24 described above makes a phase difference of the ideal component of the second detection signal S2 from the ideal component of the first detection signal S1 an odd number of times ¼ of a predetermined signal period (the signal period of the ideal component), and reduces the plurality of harmonic components of the respective first and second detection signals S1 and S2.

Note that, in the light of the production accuracy of the MR elements 50 and other factors, the positions of the resistors R11 to R14, and R21 to R24 and the positions of the element groups 31 to 38 may be slightly different from the above-described positions.

Next, a method for generating the detection value Vs according to the present example embodiment will be described. Initially, a method for generating the detection value Vs in the case where the design pitch $\lambda$ is the same as the magnetic pole pitch Lp will be described. When the target magnetic field changes periodically, the potential at the first output port E1 and the potential at the second output port E2 change in 90° different phases. The first detection signal S1 and the second detection signal S2 thus also change in 90° different phases.

For example, the processor 40 generates the detection value Vs in the following manner. The processor 40 determines an initial detection value in the range of 0° or more and less than 360° by calculating the arctangent of the ratio of the second detection signal S2 to the first detection signal S1, i.e., atan(S2/S1). The initial detection value may be the value of the arctangent itself. The initial detection value may be a value obtained by adding a predetermined angle to the value of the arctangent.

If the foregoing value of the arctangent is 0°, the position of an S pole of the magnetic field generator 3 and the position of the element group 31 in each of the resistors R11 and R13 coincide when viewed in the Z direction. If the foregoing value of the arctangent is 180°, the position of an N pole of the magnetic field generator 3 and the position of the element group 31 in each of the resistors R11 and R13 coincide when viewed in the Z direction. Therefore, the initial detection value has a correspondence with the rotation position of the magnetic field generator 3 within a range from one S pole to another S pole adjoining via one N pole.

The processor 40 also counts the number of rotations of the electrical angle from a reference position, with one period of the initial detection value as an electrical angle of 360°. The electrical angle has a correspondence with the rotation position of the magnetic field generator 3, and one rotation of the electrical angle corresponds to the amount of movement from one S pole to another S pole adjoining via one N pole. The processor 40 generates the detection value Vs having a correspondence with the rotation position of the magnetic field generator 3 on the basis of the initial detection value and the number of rotations of the electrical angle.

The phase difference between the potential at the first output port E1 and the potential at the second output port E2 when the target magnetic field changes periodically is not limited to 90°, and may be in the range of 85° to 95°, for example.

Next, a method for generating the detection value Vs in the case where the design pitch $\lambda$ is different from the magnetic pole pitch Lp will be briefly described. In such a case, the processor 40 initially performs predetermined correction processing on each of the first and second detection signals S1 and S2. The correction processing includes at least processing for generating two corrected signals having a phase difference of 90° using the first and second detection signals S1 and S2. The correction processing may further include at least either processing for correcting the amplitude of each of the first and second detection signals S1 and S2 or the two corrected signals or processing for correcting an offset in each of the first and second detection signals S1 and S2 or the two corrected signals.

The processor 40 then determines an initial detection value in the range of 0° or more and less than 360° by calculating the arctangent of the ratio of one of the two corrected signals to the other. The initial detection value may be the value of the arctangent itself. The initial detection value may be a value obtained by adding a predetermined angle to the value of the arctangent. The content of the processing for generating the detection value Vs from the initial detection value is the same as in the case where the design pitch $\lambda$ is the same as the magnetic pole pitch Lp.

Next, a manufacturing method for the magnetic sensor 2 according to the present example embodiment will be described. The manufacturing method for the magnetic sensor 2 includes a step of fabricating a plurality of first sensor portions 2A and a plurality of second sensor portions 2B, and a step of fabricating a magnetic sensor 2 by electrically connecting one of the first sensor portions 2A and one of the second sensor portions 2B.

The second sensor portions 2B may have the same structure as that of the first sensor portions 2A. In such a case, the step of fabricating the plurality of first sensor portions 2A and the plurality of second sensor portions 2B includes a step of forming a plurality of MR elements 50, a plurality of pads, a plurality of sub-pads, and a plurality of lines on an initial substrate, and a step of dividing the initial substrate into a plurality of sensor portions. The initial substrate includes a portion to later become the plurality of first substrates 10 and a portion to later become the plurality of second substrates 20. Each of the plurality of sensor portions includes a divided initial substrate, a plurality of MR elements 50 constituting four resistors, three pads, and a sub-pad.

Each of the plurality of sensor portions can be used as a first sensor portion 2A or a second sensor portion 2B. In a sensor portion used as a first sensor portion 2A, the divided initial substrate, the four resistors, the three pads, and the sub-pad serve as a first substrate 10, resistors R11, R12, R21, and R22, pads 11 to 13, and a sub-pad 15, respectively. In a sensor portion used as a second sensor portion 2B, the divided initial substrate, the four resistors, the three pads, and the sub-pad serve as a first substrate 10, resistors R13, R14, R23, and R24, pads 21 to 23, and a sub-pad 25, respectively.

The second sensor portions 2B may have a different structure from that of the first sensor portions 2A. In such case, the components of the plurality of first sensor portions 2A other than the first substrates 10 and the components of the plurality of second sensor portions 2B other than the second substrates 20 may be formed on an initial substrate. Alternatively, the components other than the first substrates 10 of the plurality of first sensor portions 2A may be formed on an initial substrate, and the components other than the second substrate 20 of the plurality of second sensor portions 2B may be formed on another initial substrate.

Next, the step of forming the plurality of MR elements 50 will be described in more detail. In the step of forming the plurality of MR elements 50, a plurality of initial MR elements to later become the plurality of MR elements 50 are initially formed. Each of the plurality of initial MR elements includes an initial magnetization pinned layer to later become the magnetization pinned layer 51, the free layer 53, and the gap layer 52.

Next, the magnetization directions of the initial magnetization pinned layers are fixed to predetermined directions using laser light and external magnetic fields in the foregoing predetermined directions. For example, a plurality of initial MR elements to later become the plurality of MR elements 50 constituting the resistors R11, R14, R22, and R23 are irradiated with laser light while an external magnetic field in the first direction is applied thereto. When the irradiation with the laser light is completed, the magnetization directions of the initial magnetization pinned layers are fixed to the first direction. This makes the initial magnetization pinned layers into the magnetization pinned layers 51, and the plurality of initial MR elements into the plurality of MR elements 50 constituting the resistors R11, R14, R22, and R23.

In a plurality of other initial MR elements to later become the plurality of MR elements 50 constituting the resistors R12, R13, R21, and R24, the magnetization direction of the initial magnetization pinned layer in each of the plurality of other initial MR elements can be fixed to the second direction by setting the direction of the external magnetic field to the second direction opposite to the first direction. The plurality of MR elements 50 are formed in such a manner.

Next, the operation and effects of the magnetic encoder 1 and the magnetic sensor 2 according to the present example embodiment will be described. In the present example embodiment, the arms R1 to R4 and the resistors R11 to R14 and R21 to R24 are configured to reduce an error equivalent to a second-order harmonic and an error due to manufacturing variations. A description thereof will now be given by making comparison with a magnetic encoder of a comparative example.

The magnetic encoder of the comparative example includes a magnetic sensor 102 of the comparative example and the magnetic field generator 3 shown in FIGS. 1 and 2. The positional relationship between the magnetic sensor 102 of the comparative example and the magnetic field generator 3 is the same as that between the first sensor portion 2A and the magnetic field generator 3 according to the present example embodiment.

Figure 12:
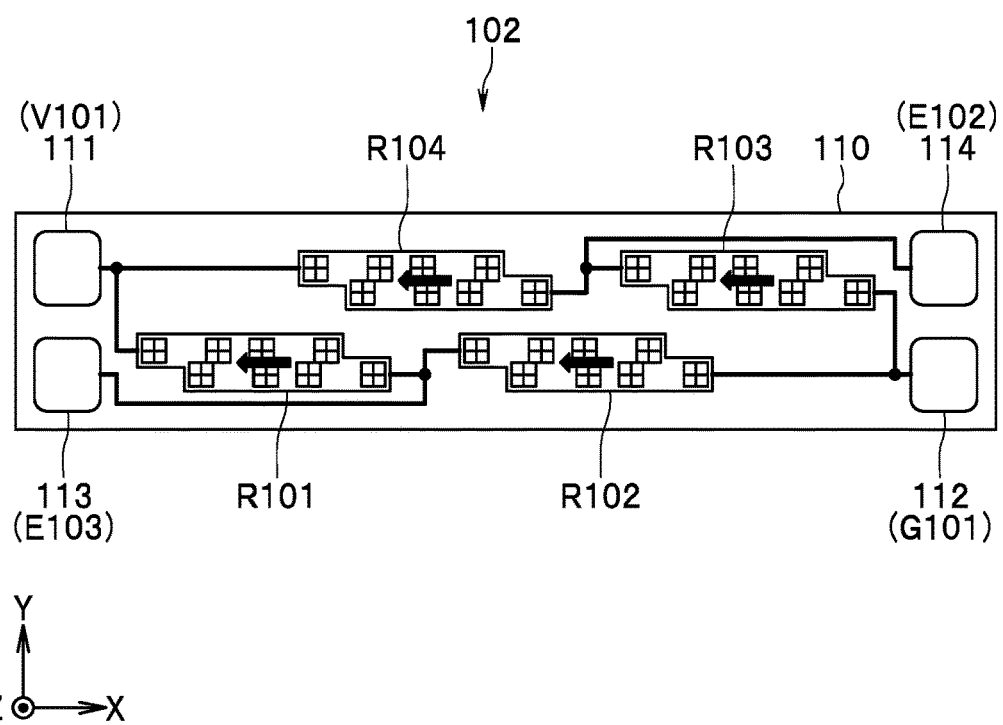
FIG. 12 is a plan view showing a magnetic sensor of a comparative example.
Figure 13:
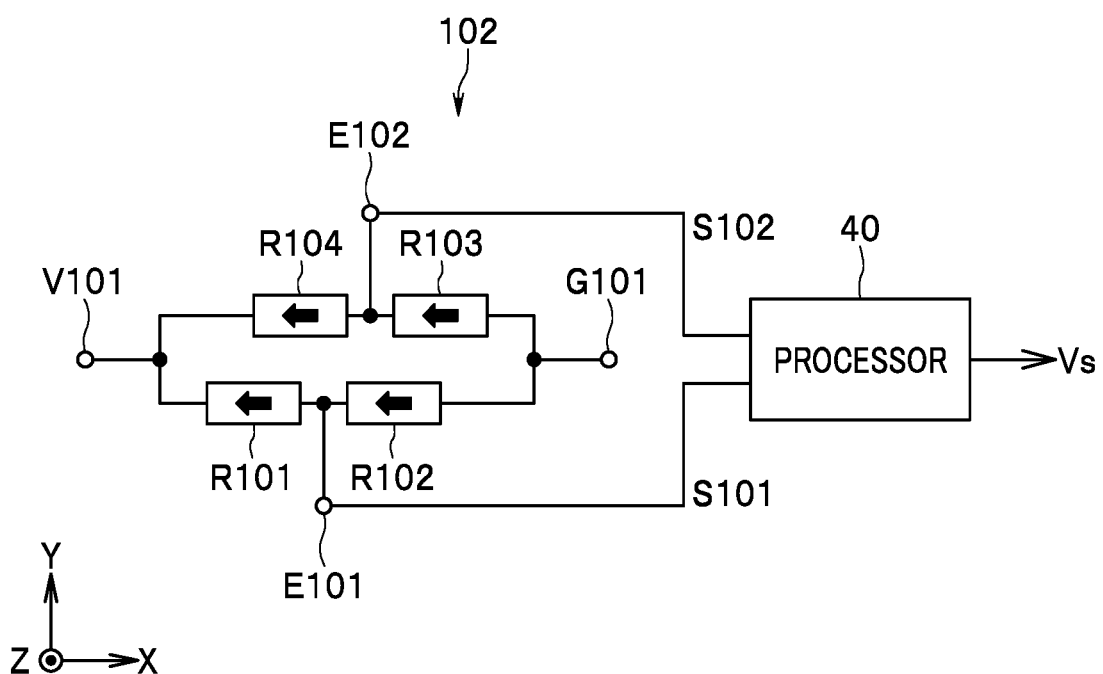
FIG. 13 is a circuit diagram showing the configuration of the magnetic sensor of the comparative example.

FIG. 12 is a plan view showing the magnetic sensor 102 of the comparative example. FIG. 13 is a circuit diagram showing the configuration of the magnetic sensor 102 of the comparative example. The configuration of the magnetic sensor 102 can be described based on the coordinate system defined by the X, Y, and Z directions. The magnetic sensor 102 includes a first resistor R101, a second resistor R102, a third resistor R103, and a fourth resistor R104, each of which is configured to change in resistance with the strength of the magnetic field component in a direction parallel to the X direction. The magnetic sensor 102 includes the plurality of MR elements 50. Each of the first to fourth resistors R101 to R104 is formed of the plurality of MR elements 50.

The magnetic sensor 102 further includes a power supply port V101, a ground port G101, a first output port E101, and a second output port E102. The ground port G101 is connected to the ground. The first and second output ports E101 and E102 are connected to the processor 40.

The magnetic sensor 102 generates a signal having a correspondence with the potential at the first output port E101 as a first detection signal S101, and generates a signal having a correspondence with the potential at the second output port E102 as a second detection signal S102. The processor 40 connected to the magnetic sensor 102 generates the detection value Vs on the basis of the first and second detection signals S101 and S102.

The first resistor R101 is provided in a path that connects the power supply port V101 and the first output port E101. The second resistor R102 is provided in a path that connects the ground port G101 and the first output port E101. The third resistor R103 is provided in a path that connects the ground port G101 and the second output port E102. The fourth resistor R104 is provided in a path that connects the power supply port V101 and the second output port E102.

The center of gravity of the second resistor R102 when viewed in the Z direction is located at a position $\lambda/2$ in the X direction away from the center of gravity of the first resistor R101 when viewed in the Z direction. The center of gravity of the third resistor R103 when viewed in the Z direction is located at a position $\lambda/2$ in the X direction away from the center of gravity of the fourth resistor R104 when viewed in the Z direction. The center of gravity of the fourth resistor R104 when viewed in the Z direction is located at a position λ/4 in the X direction away from the center of gravity of the first resistor R101 when viewed in the Z direction.

In FIGS. 12 and 13, arrows shown inside the first to fourth resistors R101 to R104 indicate first magnetization directions of magnetization pinned layers 51 in the respective plurality of MR elements 50 included in the resistors. In the comparative example, the first magnetization directions are the −X direction in all of the first to fourth resistors R101 to R104.

Each of the first to fourth resistors R101 to R104 includes a plurality of element groups. The configuration and layout of the plurality of element groups in each of the first to fourth resistors R101 to R104 are the same as those of the plurality of element groups in the resistor R11 of the magnetic sensor 2 according to the present example embodiment.

Next, the first detection signal S101 in the comparative example will be described. In the comparative example, a resistance $R_1$ of the first resistor R101 and a resistance $R_2$ of the second resistor R102 are represented in the following equations (1) and (2), respectively. Note that, in the equations (1) and (2), $R_0$ and $\Delta R$ are each a predetermined constant, and θ represents an electrical angle.

$$R_1 = R_0 + \Delta R \cos(\theta) \tag{1}$$

$$R_2 = R_0 + \Delta R \cos(\theta + \lambda/Lp \times \pi) \tag{2}$$

The first detection signal S101 is represented in the following equation (3).

$$S101 = R_2/(R_1 + R_2) \tag{3}$$

When the magnetic pole pitch Lp is equal to the design pitch λ, the first detection signal S101 is represented in the following equation (4) from the equations (1) to (3).

$$S101 = R_2/(2R_0 + \Delta R\cos(\theta) - \Delta R\cos(\theta)) = R_2/2R_0 \tag{4}$$

When the magnetic pole pitch Lp is different from the design pitch λ, the first detection signal S101 is represented in the following equation (5) from the equations (1) to (3).

$$S101 = R_2/(2R_0 + \Delta R \cos(\theta) + \Delta R \cos(\theta + \lambda/Lp \times \pi)) \tag{5}$$

As can be seen from the equation (4), when the magnetic pole pitch Lp is equal to the design pitch λ, the first detection signal S101 is equal to a constant number of times $R_2$. In this case, it is ideal that the first detection signal S101 periodically varies so as to trace an ideal sinusoidal curve according to the electrical angle θ (see the equation (2)). On the other hand, as can be seen from the equation (5), when the magnetic pole pitch Lp is different from the design pitch λ, a component that changes according to the electrical angle θ is included in a denominator in the equation (5). The component causes the first detection signal S101 to generate a harmonic component corresponding to a second-order harmonic.

The description of the first detection signal S101 also applies to the second detection signal S102. A resistance R3 of the third resistor R103, a resistance $R_4$ of the fourth resistor R104, and the second detection signal S102 can each be represented by using a sine function that changes according to the electrical angle θ. When the magnetic pole pitch Lp is different from the design pitch λ, a harmonic component corresponding to a second-order harmonic is also generated in the second detection signal S102. The harmonic component of each of the first and second detection signals S101 and S102 causes an error in the detection value Vs.

Next, the first detection signal S1 in the present example embodiment will be described. In the present example embodiment, a resistance $R_{11}$ of the resistor R11, a resistance $R_{12}$ of the resistor R12, a resistance $R_{13}$ of the resistor R13, and a resistance $R_{14}$ of the resistor R14 are represented in the following equations (6) to (9), respectively.

$$R_{11} = R_0 + \Delta R\cos(\theta) \tag{6}$$

$$R_{12} = R_0 + \Delta R\cos(\theta + \lambda/Lp \times \pi + \pi) \tag{7}$$

$$= R_0 - \Delta R\cos(\theta + \lambda/Lp \times \pi)$$

$$R_{13} = R_0 + \Delta R\cos(\theta + \pi) \tag{8}$$

$$= R_0 - \Delta R\cos(\theta + \pi)$$

$$R_{14} = R_0 + \Delta R\cos(\theta + \lambda/Lp \times \pi) \tag{9}$$

The first detection signal S1 is represented in the following equation (10).

$$S1 = (R_{13} + R_{14})/(R_{11} + R_{12} + R_{13} + R_{14}) = (R_{13} + R_{14})/4R_0 \tag{10}$$

As can be seen from the equation (10), in the present example embodiment, regardless of whether the magnetic pole pitch Lp is equal to the design pitch λ, the denominator in the equation (10) is a constant, and the first detection signal S1 is equal to a constant number of times of a sum of the resistance $R_{13}$ and the resistance $R_{14}$. Therefore, in the present example embodiment, it is ideal that the first detection signal S1 periodically varies so as to trace an ideal sinusoidal curve according to the electrical angle θ regardless of whether the magnetic pole pitch Lp is equal to the design pitch λ, (see the equations (8) and (9)).

The description of the first detection signal S1 also applies to the second detection signal S2. The second detection signal S2 is represented in an equation in which $R_{11}$, $R_{12}$, $R_{13}$, and $R_{14}$ in the equation (10) are replaced with a resistance $R_{21}$ of the resistor R21, a resistance $R_{22}$ of the resistor R22, a resistance $R_{23}$ of the resistor R23, and a resistance $R_{24}$ of the resistor R24, respectively. Similarly to the first detection signal S1, it is ideal that the second detection signal S2 periodically varies so as to trace an ideal sinusoidal curve according to the electrical angle θ regardless of whether the magnetic pole pitch Lp is equal to the design pitch λ.

As described above, the present example embodiment is configured to reduce harmonic components equivalent to second-order harmonics. According to the present example embodiment, an error occurring in the detection value Vs can thereby be reduced if the magnetic pole pitch Lp is different from the design pitch λ due to manufacturing variations or even if the magnetic pole pitch Lp and the design pitch λ are deliberately made different.

Next, a result of a first simulation demonstrating that an error due to other manufacturing variations can be reduced will be described.

In the first simulation, a model of a comparative example and a model of a first practical example were used. The model of the comparative example is a model for the magnetic encoder of the comparative example. The model of the practical example is a model for the magnetic encoder 1 according to the present example embodiment.

In the first simulation, the magnetic pole pitch Lp and the design pitch λ were both 800 μm. In the first simulation, the distances between the first and second sensors 2A and 2B and the magnetic field generator 3 in the direction parallel to the Z direction and the distance between the magnetic sensor 102 and the magnetic field generator 3 in the direction parallel to the Z direction were all 0.4 mm. Further, both a voltage applied to the power supply port V1 and a voltage applied to the power supply port V101 were 1 V.

In the first simulation, the detection value Vs in the case where the position of the rotational axis C of the magnetic field generator 3 was shifted from the designed position by 0.2 mm was determined. The difference between the rotation angle of the magnetic field generator 3 and the detection value Vs was determined as an error.

Figure 14:
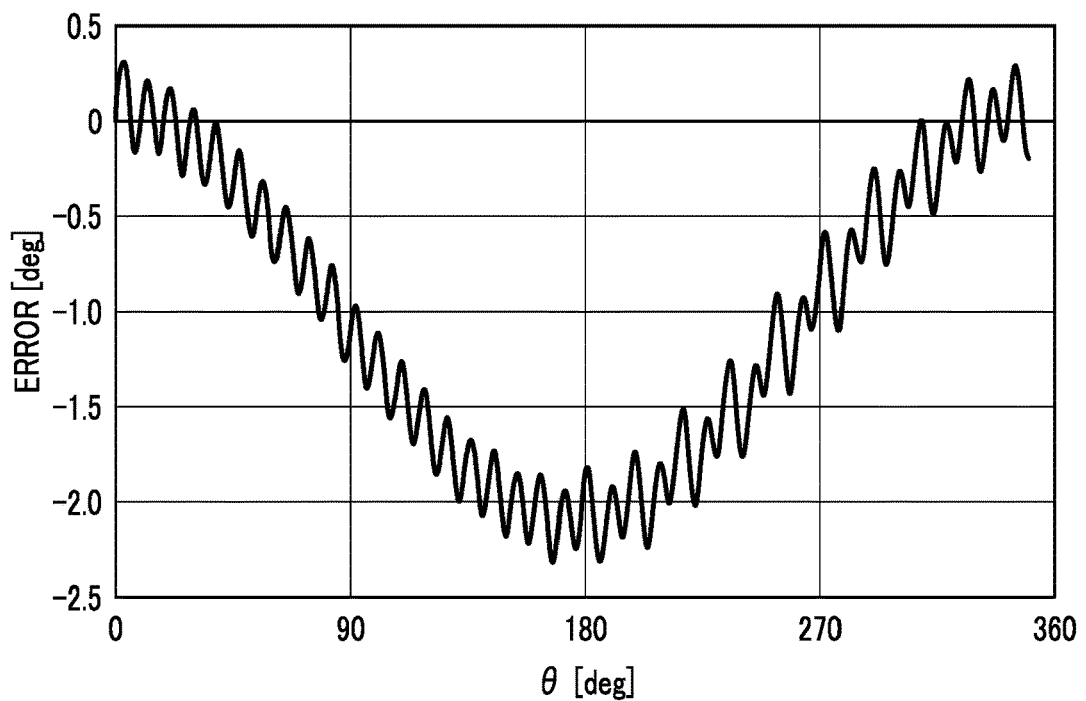
FIG. 14 is a characteristic chart showing an error in a detection value of a model of the comparative example.
Figure 15:
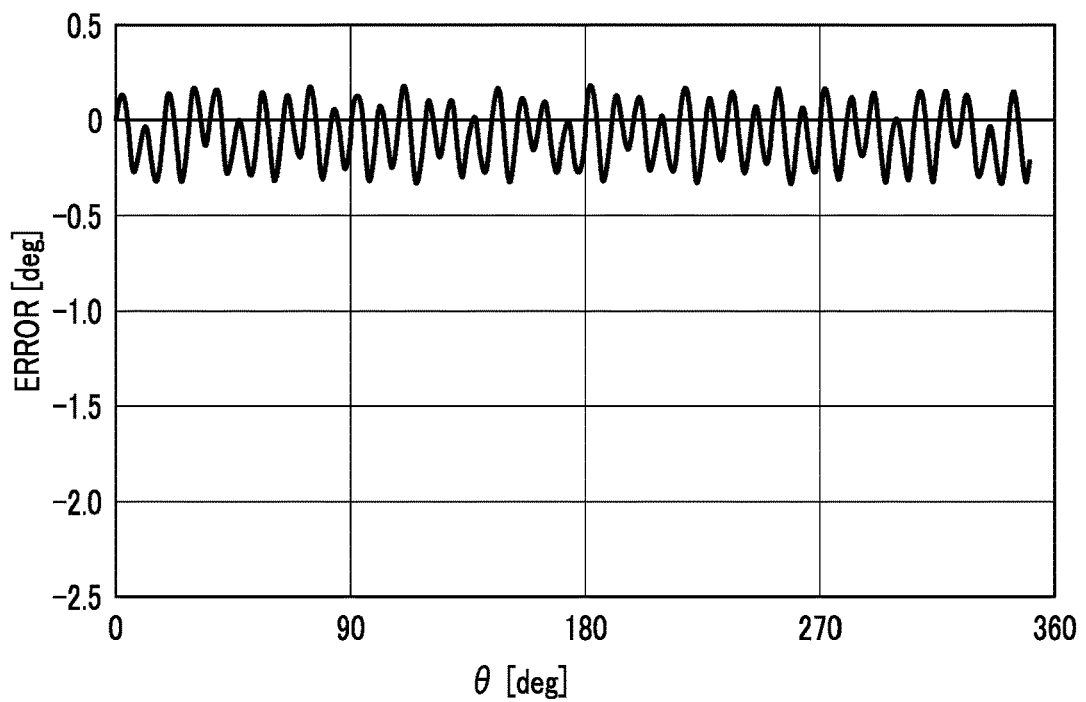
FIG. 15 is a characteristic chart showing an error in a detection value of a model of a first practical example.

FIG. 14 is a characteristic chart showing the error of the model of the comparative example. FIG. 15 is a characteristic chart showing the error of the model of the first practical example. In FIGS. 14 and 15, the horizontal axis indicates the rotation angle, and the vertical axis the error. As can be seen from FIGS. 14 and 15, according to the present example embodiment, the error due to the positional shift of the magnetic field generator 3 can be reduced.

Next, other effects of the present example embodiment will be described. In the present example embodiment, the magnetic sensor 2 is configured to detect the target magnetic field generated by the magnetic field generator 3. The strength of the magnetic field component to be detected varies with position. In particular, in the present example embodiment, each of the arms R1 to R4 in the bridge circuit 4 of the magnetic sensor 2 is configured to have sensitivity to the magnetic field component to be detected.

Meanwhile, each of the arms R1 to R4 does not have sensitivity to the uniform external magnetic field. In other words, the resistance of each of the arms R1 to R4 does not change or changes little if the uniform external magnetic field is applied to the magnetic sensor 2. A resistance between given two of the pads 11 to 13 and 21 to 23 therefore also does not change or changes little if the uniform external magnetic field is applied to the magnetic sensor 2. The potential at each of the first and second output ports E1 and E2 also does not change or changes little if the power supply port V1 is connected to a power supply with the uniform external magnetic field applied to the magnetic sensor 2.

As described above, since each of the arms R1 to R4 does not have sensitivity to the uniform external magnetic field, the magnetic sensor 2 cannot be inspected by a method of measuring a resistance between two pads or a method of measuring a potential at each of the two pads, when the uniform external magnetic field is used as a magnetic field for inspection.

By contrast, in the present example embodiment, the sub-pad 15 is provided on the first substrate 10, and the sub-pad 25 on the second substrate 20. The sub-pad 15 is connected to the connection point of the resistors R21 and R22. The resistance of the resistor R21 changes with the strength and direction of the uniform external magnetic field. Consequently, the resistance between the pad 11 and the sub-pad 15 also changes with the strength and direction of the uniform external magnetic field. The resistance of the resistor R22 also changes with the strength and direction of the uniform external magnetic field. Consequently, the resistance between the pad 12 and the sub-pad 15 and the resistance between the pad 13 and the sub-pad 15 change with the strength and direction of the uniform external magnetic field. When the power supply port V1 is connected to the power supply, the potential at the sub-pad 15 also changes with the strength and direction of the uniform external magnetic field. Hence, according to the present example embodiment, even when the uniform external magnetic field is used as the magnetic field for inspection, the first sensor portion 2A can be inspected by a method of measuring a resistance by using the sub-pad 15 or a method of measuring a potential at the sub-pad 15.

The foregoing description of the sub-pad 15 applies to the sub-pad 25 as well. The description of the sub-pad 15 applies to the sub-pad 25 if the pads 11 to 13, the sub-pad 15, and the resistors R21 and R22 in the description are replaced with the pads 21 to 23, the sub-pad 25, and the resistors R23 and R24, respectively. According to the present example embodiment, even when the uniform external magnetic field is used as the magnetic field for inspection, the second sensor portion 2B can be inspected by a method of measuring a resistance using the sub-pad 25 or a method of measuring a potential at the sub-pad 25.

The first substrate 10 may include another sub-pad connected to the connection point of the resistors R11 and R12 instead of the sub-pad 15 or in addition to the sub-pad 15. The second substrate 20 may include another sub-pad connected to the connection point of the resistors R13 and R14 instead of the sub-pad 25 or in addition to the sub-pad 25.

Second Example Embodiment

Figure 16:
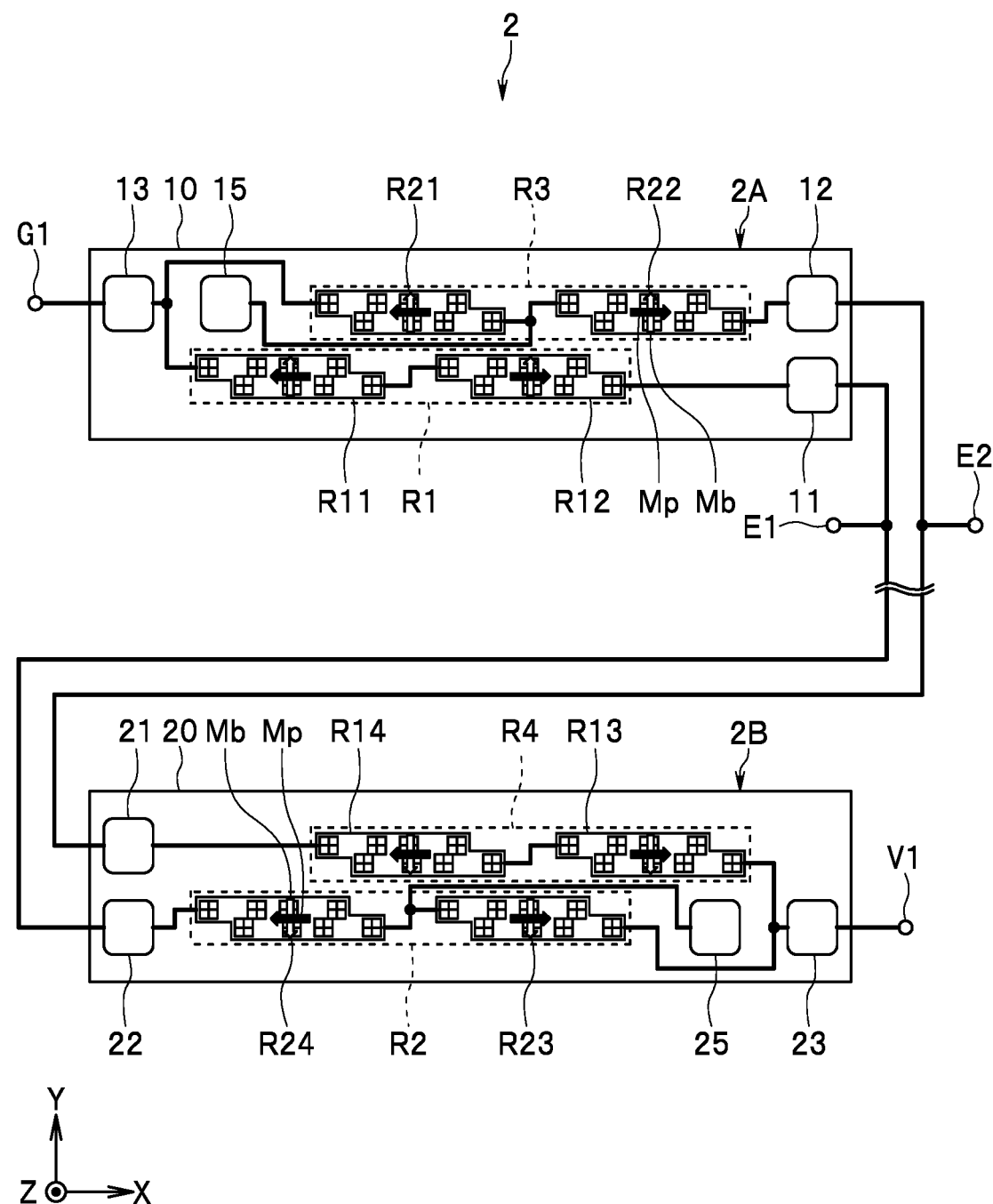
FIG. 16 is a plan view showing a magnetic sensor of a second example embodiment of the technology.
Figure 17:
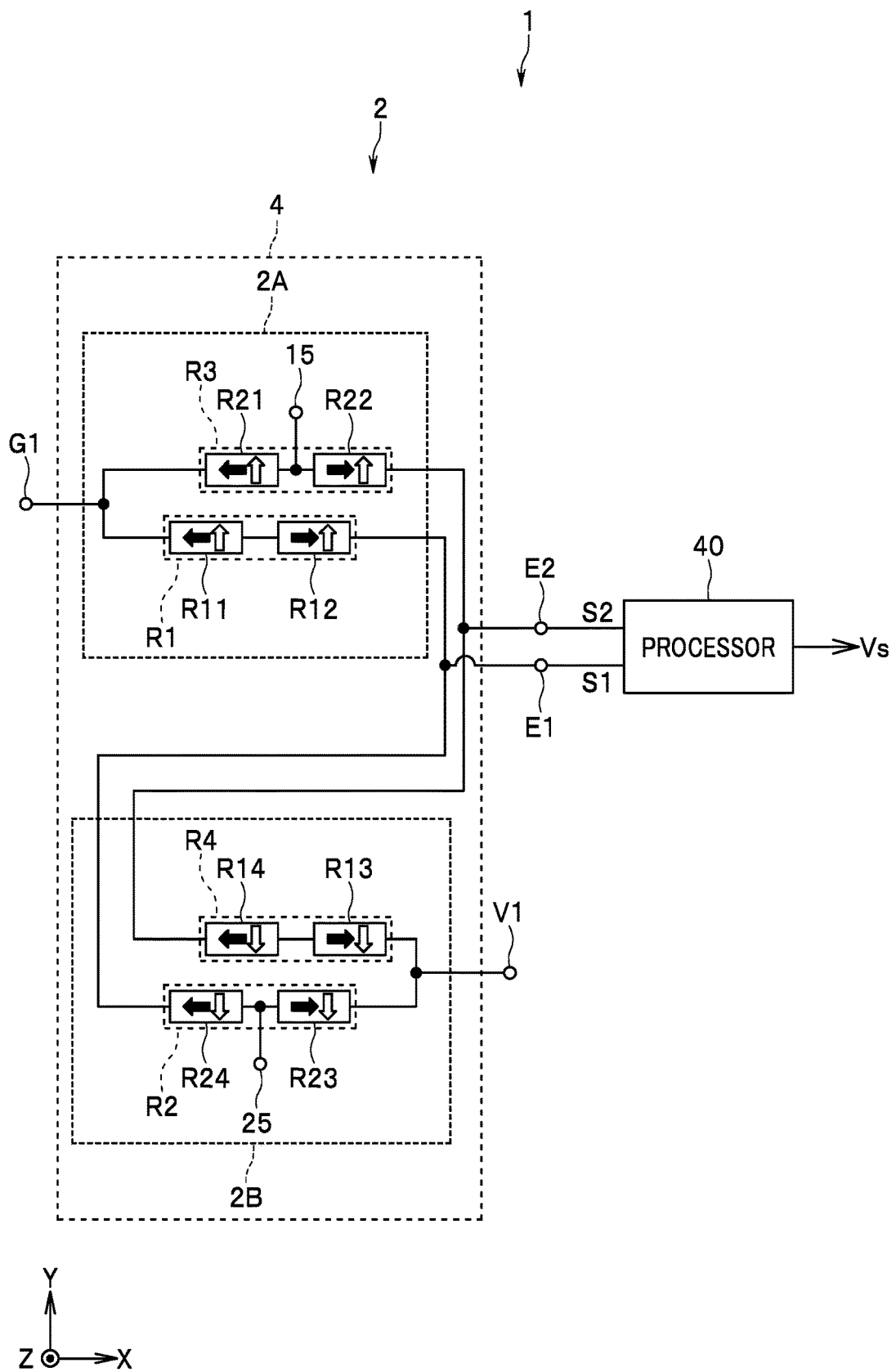
FIG. 17 is a circuit diagram showing the configuration of the magnetic sensor of the second example embodiment of the technology.

Next, a second example embodiment of the technology will be described. A configuration of a magnetic sensor 2 according to the present example embodiment will initially be described with reference to FIGS. 16 and 17. FIG. 16 is a plan view showing the magnetic sensor 2. FIG. 17 is a circuit diagram showing the configuration of the magnetic sensor 2.

In the present example embodiment, the orientation of the second sensor portion 2B is different from that in the first example embodiment. The second sensor portion 2B according to the present example embodiment is located in an orientation 180° rotated from the orientation in the first example embodiment about an axis parallel to the Z direction. The layout of the second sensor portion 2B is the same as that in the first example embodiment.

In the present example embodiment, the definition of the second coordinate system shown in FIG. 4 according to the first example embodiment is different from that in the first example embodiment. In the present example embodiment, the D21 direction agrees with the −X direction, and the D22 direction the −Y direction. The reference direction DR is the same as the D21 direction.

In the present example embodiment, the connection relationship between the pads 11 and 12 of the first substrate 10 of the first sensor portion 2A and the pads 21 and 22 of the second substrate 20 of the second sensor portion 2B is different from that in the first example embodiment. In the present example embodiment, the pad 22 is electrically connected to the pad 11 by a third line. The third line is electrically connected to the first output port E1. The pad 21 is electrically connected to the pad 12 by a fourth line. The fourth line is electrically connected to the second output port E2.

In the present example embodiment, the arms R2 and R4 of the bridge circuit 4 are different from those in the first example embodiment. In the present example embodiment, the arm R4 according to the first example embodiment serves as the arm R2 according to the present example embodiment, and the arm R2 according to the first example embodiment the arm R4 according to the present example embodiment. In the present example embodiment, one end of the arm R2 is thus electrically connected to the pad 22. One end of the arm R4 is electrically connected to the pad 21. The other ends of the arms R2 and R4 are electrically connected to the pad 23.

In the present example embodiment, the two resistors included in each of the arms R2 and R4 are different from those in the first example embodiment. In the present example embodiment, the arm R2 includes the two resistors R23 and R24. The arm R4 includes the two resistors R13 and R14. In particular, in the present example embodiment, the resistors R13, R14, R23, and R24 correspond to the "eighth resistor", the "seventh resistor", the "sixth resistor", and the "fifth resistor" of the technology, respectively.

In the present example embodiment, the direction of the bias magnetic field at each of the plurality of MR elements 50 provided on the second substrate 20 is different from that in the first example embodiment. In FIG. 16, the directions of the bias magnetic fields are indicated by the arrows denoted by the symbol Mb. In FIG. 17, the directions of the bias magnetic fields are indicated by the hollow arrows. In the MR elements 50 provided on the second substrate 20, the directions of the bias magnetic fields are the D22 direction. In other words, the directions of the bias magnetic fields on the second substrate 20 are 90° rotated counterclockwise from the reference direction DR (see FIG. 4) when viewed from above the magnetic field generator 3 (viewed in the Z direction).

If the reference direction DR is opposite to the direction shown in FIGS. 3 and 4, the directions of the bias magnetic fields on the second substrate 20 are 90° rotated clockwise from the reference direction DR when viewed from above the magnetic field generator 3 (viewed in the Z direction). In such a case, the directions of the bias magnetic fields on the first substrate 10 are also 90° rotated clockwise from the reference direction DR when viewed from above the magnetic field generator 3 (viewed in the Z direction).

Like the first example embodiment, the angles that the bias magnetic fields form with the reference direction DR are not limited to 90° and may be in the range of 85° to 95°, for example.

Next, effects of the present example embodiment will be described with reference to a result of a second simulation. The second simulation used the model of the comparative example described in the first example embodiment and a model of a second practical example. The model of the comparative example is a model of the magnetic encoder according to the comparative example. The model of the second practical example is a model of the magnetic encoder 1 according to the present example embodiment.

The condition of the second simulation is the same as that of the first simulation except for the position of the rotation axis C of the magnetic field generator 3. In the second simulation, the position of the rotation axis C of the magnetic field generator 3 was the same as the designed position.

In the second simulation, the amplitude of the first detection signal S101 was determined by applying a uniform external magnetic field in the direction parallel to the Y direction to the magnetic sensor 102 of the comparative example and changing the strength of the uniform external magnetic field. The ratio of the determined amplitude to the amplitude of the first detection signal S101 when the strength of the uniform external magnetic field was 0 was then determined as the amplitude ratio of the model of the comparative example.

Similarly, in the second simulation, the amplitude of the first detection signal S1 was determined by applying a uniform external magnetic field in the direction parallel to the Y direction to the magnetic sensor 2 and changing the strength of the uniform external magnetic field. The ratio of the determined amplitude to the amplitude of the first detection signal S1 when the strength of the uniform external magnetic field was 0 was then determined as the amplitude ratio of the second practical example.

The strength of the uniform external magnetic field will hereinafter be expressed in a positive value when the direction of the uniform external magnetic field is the Y direction, and in a negative value when the direction of the uniform external magnetic field is the −Y direction. The strength of the uniform external magnetic field will also be expressed in terms of the magnitude of the magnetic flux density corresponding to the strength of the uniform external magnetic field. In the second simulation, the uniform external magnetic field was changed within the range of −5 to 5 mT.

Figure 18:
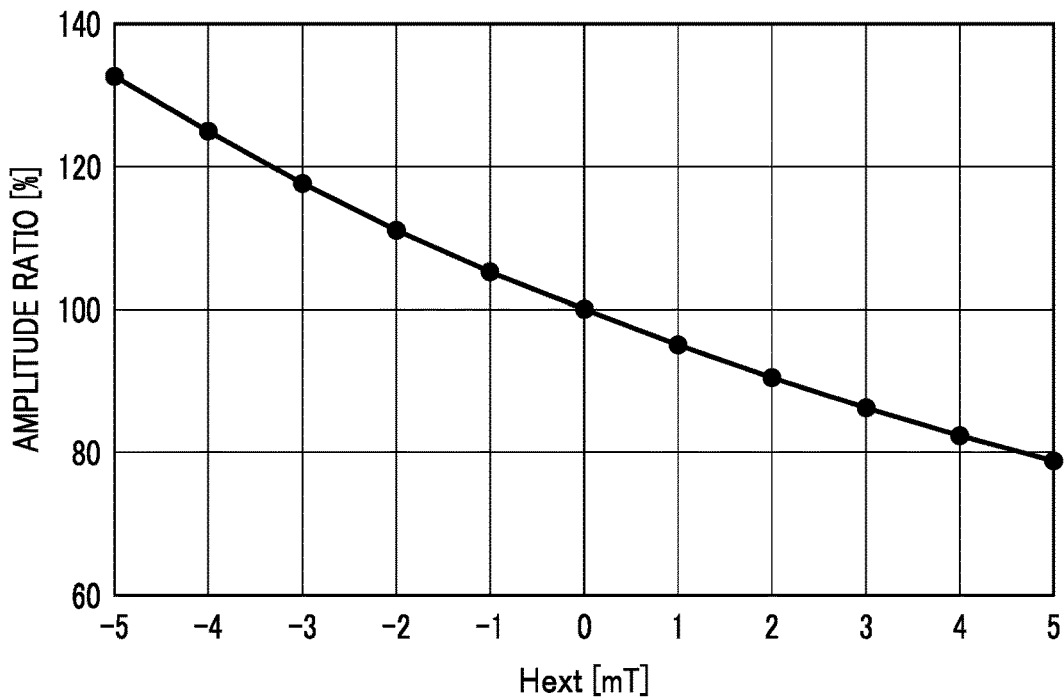
FIG. 18 is a characteristic chart showing an amplitude ratio of the model of the comparative example.
Figure 19:
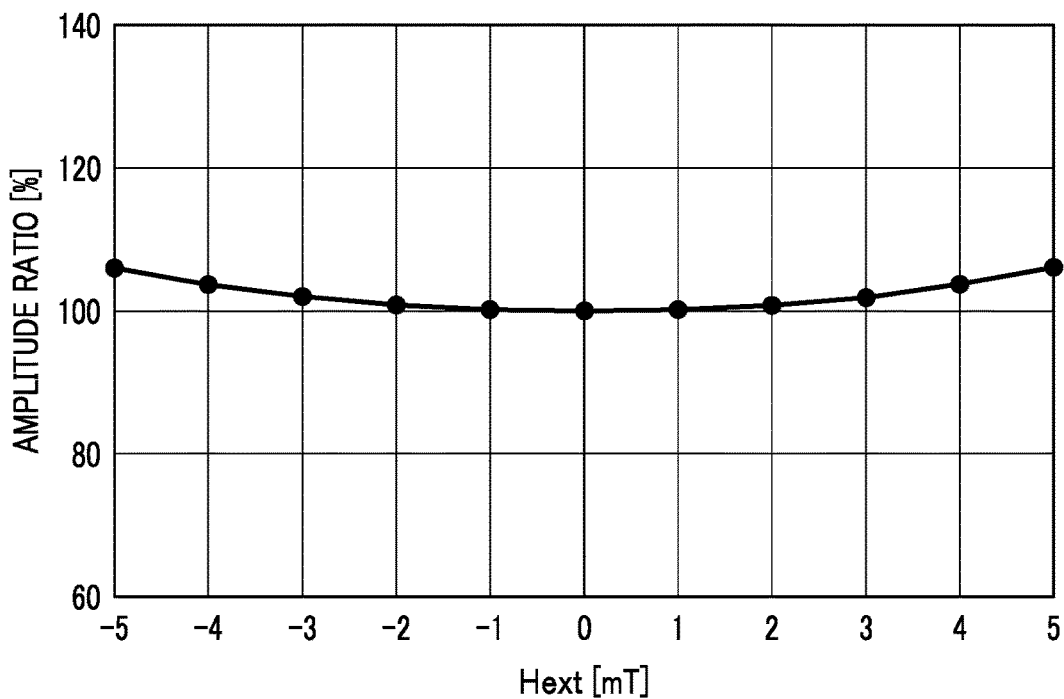
FIG. 19 is a characteristic chart showing an amplitude ratio of a model of a second practical example.

FIG. 18 is a characteristic chart showing the amplitude ratio of the model of the comparative example. FIG. 19 is a characteristic chart showing the amplitude ratio of the model of the second practical example. In FIGS. 18 and 19, the horizontal axis indicates the strength of a uniform external magnetic field Hext, and the vertical axis the amplitude ratio. As can be seen from FIGS. 18 and 19, according to the present example embodiment, variations in the first detection signal S1 due to the uniform external magnetic field can be reduced.

The result of the second simulation also applies to the second detection signal S2. More specifically, according to the present example embodiment, variations in the second detection signal S2 due to the uniform external magnetic field can be reduced. If, for example, a voice coil motor is used as a driving device of the magnetic field generator 3, the uniform external magnetic field occurs from the magnet of the voice coil motor.

The configuration, operation and effects of the present example embodiment are otherwise the same as those of the first example embodiment.

Third Example Embodiment

Figure 20:
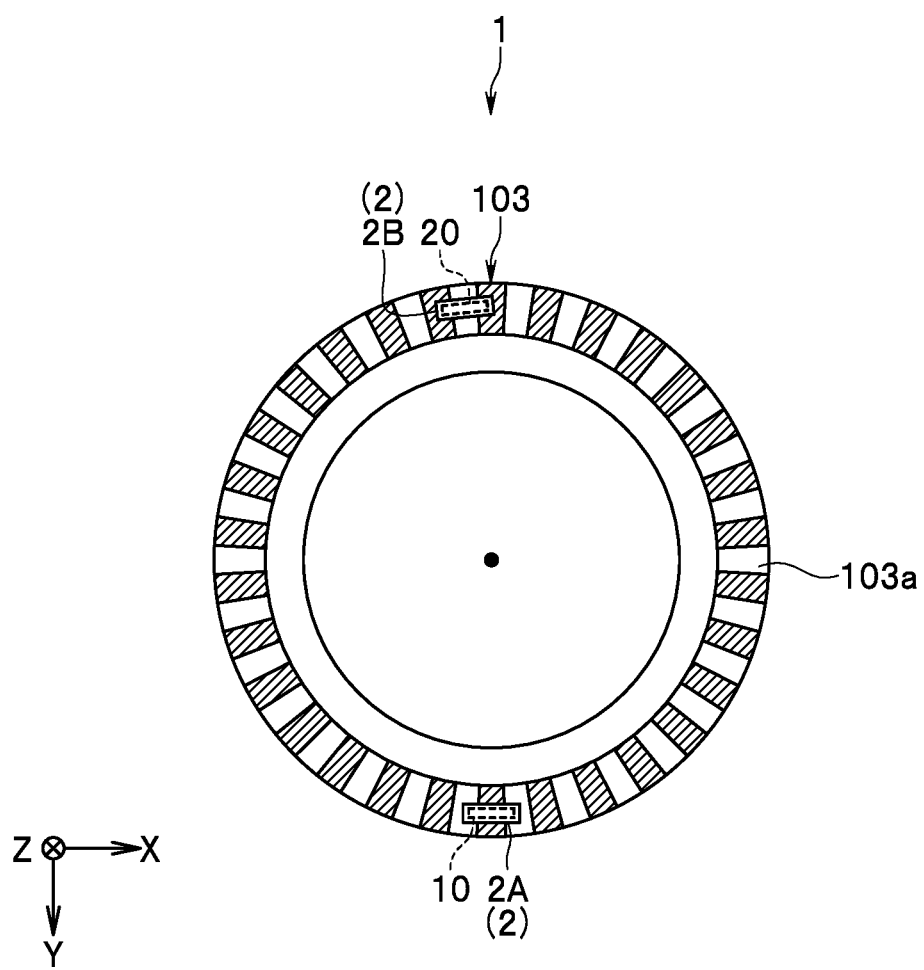
FIG. 20 is a plan view showing a magnetic encoder according to a third example embodiment of the technology.

Next, a magnetic encoder according to a third example embodiment of the technology will be described with reference to FIG. 20. FIG. 20 is a plan view showing the magnetic encoder according to the present example embodiment.

A magnetic encoder 1 according to the present example embodiment includes a magnetic field generator 103 instead of the magnetic field generator 3 according to the first example embodiment. The magnetic field generator 103 has the same configuration as that of the magnetic field generator 3 except for the number of pairs of N and S poles. The number of pairs of N and S poles of the magnetic field generator 103 is an even number. In the example shown in FIG. 20, the number of pairs of N and S poles is 30. For ease of description, in FIG. 20, either N poles or S poles are shown hatched.

The magnetic field generator 103 has an end surface 103a located at an end in one direction parallel to the rotation axis C. The plurality of pairs of N and S poles are provided on the end surface 103a. Each of the first and second sensors 2A and 2B of the magnetic sensor 2 is opposed to the end surface 103a of the magnetic field generator 103.

The numbers of N and S poles will be denoted by M. In the present example embodiment, M is an even number. The second substrate 20 (second sensor portion 2B) is located at a position $(180+n\times360/M\pm360/(2M))°$ rotated from the first substrate 10 (first sensor portion 2A) about the rotation axis C, where n is an integer. FIG. 20 shows an example where M is 30 and n is 0. In this example, the second substrate 20 (second sensor portion 2B) is located at a position 174° (clockwise when viewed from above the plane of FIG. 20) or 186° (counterclockwise when viewed from above the plane of FIG. 20) rotated from the first substrate 10 (first sensor portion 2A) about the rotation axis C.

The second sensor portion 2B of the magnetic sensor 2 may have the same configuration as that in the first example embodiment or the second example embodiment. If the second sensor portion 2B has the same configuration as that in the first example embodiment, then in the example shown in FIG. 20, the D21 direction (see FIG. 4) agrees with a direction 6° rotated from the X direction to the Y direction, and the D22 direction (see FIG. 4) agrees with a direction 6° rotated from the Y direction to the −X direction. If the second sensor portion 2B has the same configuration as that in the second example embodiment, then in the example shown in FIG. 20, the D21 direction (see FIG. 4) agrees with a direction 6° rotated from the −X direction to the −Y direction, and the D22 direction (see FIG. 4) agrees with a direction 6° rotated from the −Y direction to the X direction.

The configuration, operation and effects of the present example embodiment are otherwise the same as those of the first or second example embodiment.

Fourth Example Embodiment

Figure 21:
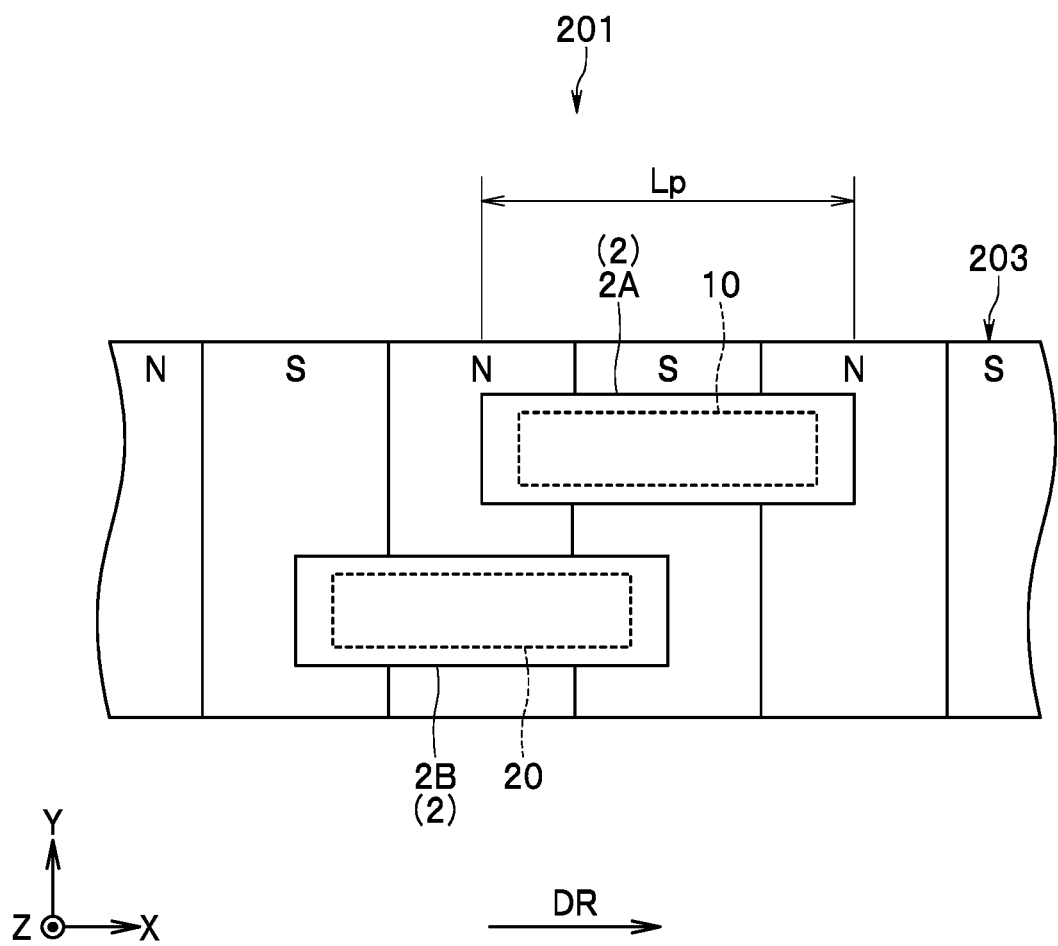
FIG. 21 is a plan view showing a magnetic encoder according to a fourth example embodiment of the technology.

Next, a magnetic encoder according to a fourth example embodiment of the technology will be described with reference to FIG. 21. FIG. 21 is a plan view showing the magnetic encoder according to the present example embodiment.

A magnetic encoder 201 according to the present example embodiment includes the magnetic sensor 2 described in the first or second example embodiment and a magnetic field generator 203. The magnetic field generator 203 is a linear scale magnetized with a plurality of pairs of N and S poles in a linear direction. The magnetic sensor 2 or the magnetic field generator 203 can be moved along the longitudinal direction of the magnetic field generator 203.

In the present example embodiment, a direction parallel to the longitudinal direction of the magnetic field generator 203 will be referred to as the X direction. The first sensor portion 2A and the second sensor portion 2B of the magnetic sensor 2 are located at a position away from the magnetic field generator 203 in the Z direction. The magnetic sensor 2 is configured so that the strength of a magnetic field component of the target magnetic field in a direction parallel to the X direction can be detected.

The first coordinate system (see FIG. 3) according to the present example embodiment is defined as follows. In the present example embodiment, the D11 direction agrees with the X direction, and the D12 direction the Y direction.

The second coordinate system (see FIG. 4) according to the present example embodiment is defined as follows. If the second sensor portion 2B has the same configuration as that in the first example embodiment, the D21 direction agrees with the X direction, and the D22 direction the Y direction. If the second sensor portion 2B has the same configuration as that in the second example embodiment, the D21 direction agrees with the −X direction, and the D22 direction the −Y direction.

The reference direction DR according to the present example embodiment is the same as the D11 direction. If the second sensor portion 2B has the same configuration as that in the first example embodiment, the reference direction DR is also the same as the D21 direction. If the second sensor portion 2B has the same configuration as that in the second example embodiment, the reference direction DR is also the same as the −D21 direction.

In the present example embodiment, the first sensor portion 2A and the second sensor portion 2B are located at respective different positions in a direction parallel to the Y direction. In particular, in the present example embodiment, the second sensor portion 2B is located in front of the first sensor portion 2A in the −Y direction.

In the present example embodiment, the first sensor portion 2A and the second sensor portion 2B are located at respective different positions in the direction parallel to the X direction. The second sensor portion 2B may be located at a position an odd number of times of ½ the magnetic pole pitch Lp away from the first sensor portion 2A in the X direction or the −X direction. FIG. 21 shows an example where the second sensor portion 2B is located at a position ½ the magnetic pole pitch Lp away from the first sensor portion 2A in the −X direction.

The configuration, operation and effects of the present example embodiment are otherwise the same as those of the first or second example embodiment.

Fifth Example Embodiment

Figure 22:
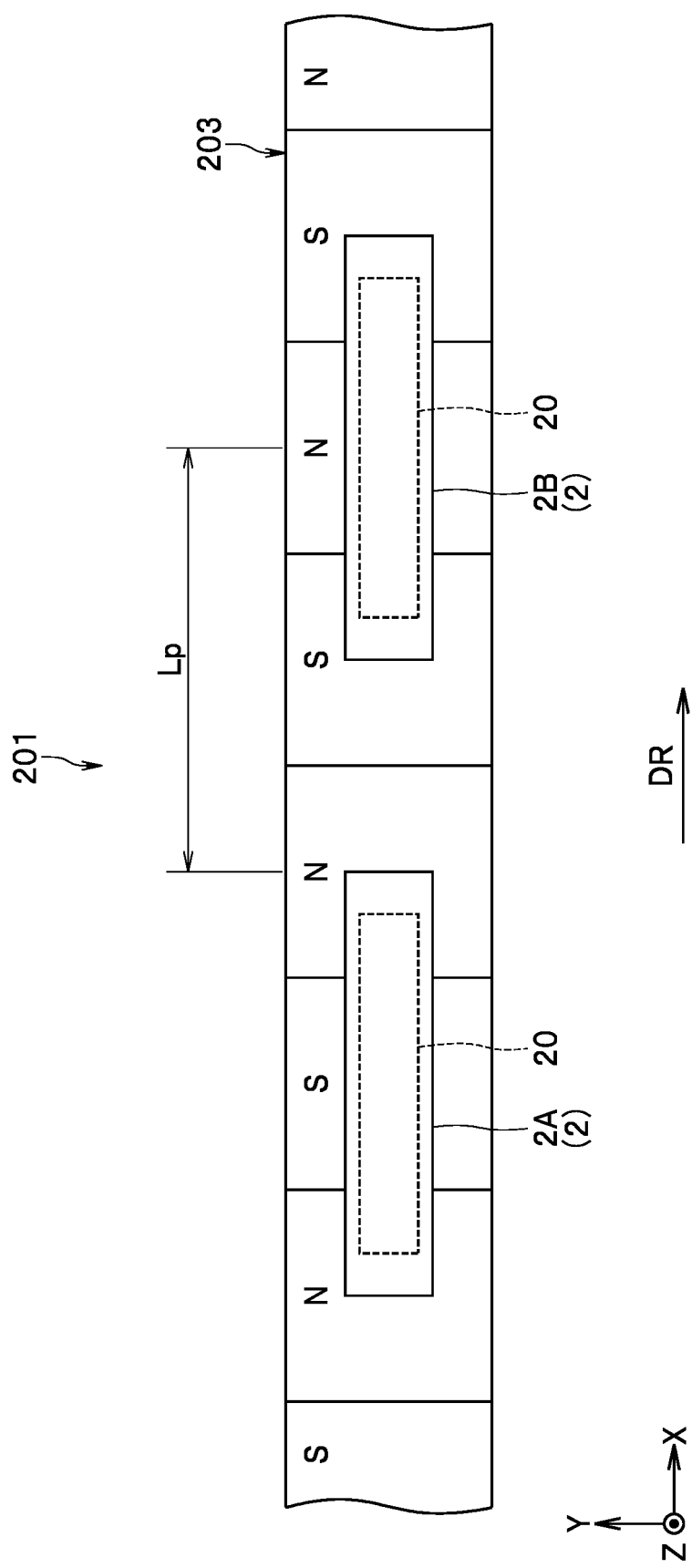
FIG. 22 is a plan view showing a magnetic encoder according to a fifth example embodiment of the technology.

Next, a magnetic encoder according to a fifth example embodiment of the technology will be described with reference to FIG. 22. FIG. 22 is a plan view showing the magnetic encoder according to the present example embodiment.

In the present example embodiment, the layout of the second sensor portion 2B of the magnetic sensor 2 is different from that in the third example embodiment. In the present example embodiment, the first sensor portion 2A and the second sensor portion 2B are located at the same position in a direction parallel to the Y direction. The second sensor portion 2B is located at a position ½ the magnetic pole pitch Lp away from the first sensor portion 2A in the X direction.

The configuration, operation and effects of the present example embodiment are otherwise the same as those of the fourth example embodiment.

The technology is not limited to the foregoing example embodiments, and various modifications may be made thereto. For example, the number and layout of the MR elements 50 are not limited to the examples described in the example embodiments but may be freely set as long as the requirements set forth in the claims are satisfied. The layout of each of the first and second substrates 10 and 20 is not limited to the examples described in the example embodiments and may be freely determined as long as the requirements of the claims are satisfied.

As described above, a magnetic sensor according to one embodiment of the technology includes a bridge circuit including a plurality of arms, a power supply port, a ground port, a first output port, a first substrate, and a second substrate. Each of the plurality of arms includes a plurality of magnetoresistive elements and is configured to change in resistance with a periodic change in a target magnetic field. The plurality of arms include a first arm provided on the first substrate and a second arm provided on the second substrate. The first arm is provided between the ground port and the first output port in circuit configuration. The second arm is provided between the power supply port and the first output port in the circuit configuration. The first arm includes a first resistor and a second resistor connected in series. The second arm includes a third resistor and a fourth resistor connected in series.

Each of the plurality of magnetoresistive elements includes a magnetization pinned layer having a first magnetization whose direction is fixed, a free layer having a second magnetization whose direction is variable, and a gap layer located between the magnetization pinned layer and the free layer. The first magnetization of the magnetization pinned layer in the first resistor includes a component in a first magnetization direction. The first magnetization of the magnetization pinned layer in the second resistor includes a component in a second magnetization direction opposite to the first magnetization direction. The first magnetization of the magnetization pinned layer in the third resistor includes a component in a third magnetization direction. The first magnetization of the magnetization pinned layer in the fourth resistor includes a component in a fourth magnetization direction opposite to the third magnetization direction.

The first resistor and the second resistor are located so that the second magnetization of the free layer in the first resistor includes a component in the first magnetization direction and the second magnetization of the free layer in the second resistor includes a component in the second magnetization direction at a predetermined timing when the target magnetic field changes periodically. The third resistor and the fourth resistor are located so that the second magnetization of the free layer in the third resistor includes a component in the fourth magnetization direction and the second magnetization of the free layer in the fourth resistor includes a component in the third magnetization direction at the predetermined timing. The second substrate is located at a position away from the first substrate so that a phase of the resistance of the second arm when the target magnetic field changes periodically is different from that of the resistance of the first arm when the target magnetic field changes periodically.

In the magnetic sensor according to one embodiment of the technology, the resistance of the first arm and the resistance of the second arm may change in 180° different phases with the periodic change in the target magnetic field.

In the magnetic sensor according to one embodiment of the technology, timing when the second magnetization of the free layer in the first resistor intersects at right angles with the first magnetization of the magnetization pinned layer in the first resistor may be the same as timing when the second magnetization of the free layer in the second resistor intersects at right angles with the first magnetization of the magnetization pinned layer in the second resistor. Timing when the second magnetization of the free layer in the third resistor intersects at right angles with the first magnetization of the magnetization pinned layer in the third resistor may be the same as timing when the second magnetization of the free layer in the fourth resistor intersects at right angles with the first magnetization of the magnetization pinned layer in the fourth resistor.

In the magnetic sensor according to one embodiment of the technology, timing when the second magnetization of the free layer in the first resistor intersects at right angles with the first magnetization of the magnetization pinned layer in the first resistor may be different from timing when the second magnetization of the free layer in the second resistor intersects at right angles with the first magnetization of the magnetization pinned layer in the second resistor. Timing when the second magnetization of the free layer in the third resistor intersects at right angles with the first magnetization of the magnetization pinned layer in the third resistor may be different from timing when the second magnetization of the free layer in the fourth resistor intersects at right angles with the first magnetization of the magnetization pinned layer in the fourth resistor.

The magnetic sensor according to one embodiment of the technology may further include a second output port. The plurality of arms may further include a third arm provided on the first substrate and a fourth arm provided on the second substrate. The third arm may be provided between the ground port and the second output port in the circuit configuration. The fourth arm may be provided between the power supply port and the second output port in the circuit configuration. The third arm may include a fifth resistor and a sixth resistor connected in series. The fourth arm may include a seventh resistor and an eighth resistor connected in series. The first magnetization of the magnetization pinned layer in the fifth resistor may include a component in the first magnetization direction. The first magnetization of the magnetization pinned layer in the sixth resistor may include a component in the second magnetization direction. The first magnetization of the magnetization pinned layer in the seventh resistor may include a component in the third magnetization direction. The first magnetization of the magnetization pinned layer in the eighth resistor may include a component in the fourth magnetization direction. The fifth resistor and the sixth resistor may be located so that the second magnetization of the free layer in the fifth resistor includes a component in the first magnetization direction and the second magnetization of the free layer in the sixth resistor includes a component in the second magnetization direction at the predetermined timing. The seventh resistor and the eighth resistor may be located so that the second magnetization of the free layer in the seventh resistor includes a component in the fourth magnetization direction and the second magnetization of the free layer in the eighth resistor includes a component in the third magnetization direction at the predetermined timing. A potential at the first output port and a potential at the second output port may change in respective different phases with the periodic change in the target magnetic field. The potential at the first output port and the potential at the second output port may change in 90° different phases.

A magnetic encoder according to one embodiment of the technology includes the magnetic sensor according to one embodiment of the technology and a magnetic field generator that generates the target magnetic field. The magnetic sensor and the magnetic field generator are configured so that the target magnetic field changes periodically when at least one of the magnetic sensor and the magnetic field generator operates.

In the magnetic encoder according to one embodiment of the technology, each of the plurality of magnetoresistive elements may be configured so that a bias magnetic field is applied to the free layer. A direction of the bias magnetic field at each of the plurality of magnetoresistive elements included in the first arm may be a first direction intersecting with a reference direction that is a direction having a correspondence with a direction of movement of the magnetic field generator relative to the magnetic sensor. A direction of the bias magnetic field at each of the plurality of magnetoresistive elements included in the second arm may be a second direction intersecting with the reference direction. In such a case, either one of the first and second directions may be a direction 90° rotated clockwise from the reference direction when viewed from above the magnetic field generator. The other of the first and second directions may be a direction 90° rotated counterclockwise from the reference direction when viewed from above the magnetic field generator. Alternatively, in such a case, the first direction and the second direction may both be directions rotated 90° clockwise or counterclockwise from the reference direction when viewed from above the magnetic field generator.

In the magnetic encoder according to one embodiment of the technology, the magnetic field generator may be a magnetic scale including M pairs of N and S poles alternately arranged around a rotation axis. M may be an odd number. In such a case, the second substrate may be located at a position (180+n×360/M)° rotated from the first substrate about the rotation axis, where n is an integer. Alternatively, M may be an even number. In such a case, the second substrate may be located at a position (180+n×360/M±360/(2M))° rotated from the first substrate about the rotation axis, where n is an integer.

In the magnetic encoder according to one embodiment of the technology, the magnetic field generator may be a magnetic scale including a plurality of pairs of N and S poles alternately arranged in a predetermined direction.

A manufacturing method for a magnetic sensor according to one embodiment of the technology includes forming a plurality of magnetoresistive elements. The forming the plurality of magnetoresistive elements includes forming a plurality of initial magnetoresistive elements each including an initial magnetization pinned layer to later become the magnetization pinned layer, the free layer, and the gap layer, and fixing the first magnetization direction of the initial magnetization pinned layer by using laser light and an external magnetic field.

Obviously, many modifications and variations of the technology are possible in the light of the above teachings. Thus, it is to be understood that, within the scope of the appended claims and equivalents thereof, the technology may be practiced in other example embodiments than the foregoing example embodiments.

What is claimed is:

1. A magnetic sensor comprising a bridge circuit including a plurality of arms, a power supply port, a ground port, a first output port, a first substrate, and a second substrate, wherein:
   each of the plurality of arms includes a plurality of magnetoresistive elements and is configured to change in resistance with a periodic change in a target magnetic field;
   the plurality of arms include a first arm provided on the first substrate and a second arm provided on the second substrate;
   the first arm is provided between the ground port and the first output port in a circuit configuration;
   the second arm is provided between the power supply port and the first output port in the circuit configuration;
   the first arm includes a first resistor and a second resistor connected in series;
   the second arm includes a third resistor and a fourth resistor connected in series;
   each of the plurality of magnetoresistive elements includes a magnetization pinned layer having a first magnetization whose direction is fixed, a free layer having a second magnetization whose direction is variable, and a gap layer located between the magnetization pinned layer and the free layer;
   the first magnetization of the magnetization pinned layer in the first resistor includes a component in a first magnetization direction;
   the first magnetization of the magnetization pinned layer in the second resistor includes a component in a second magnetization direction opposite to the first magnetization direction;
   the first magnetization of the magnetization pinned layer in the third resistor includes a component in a third magnetization direction;
   the first magnetization of the magnetization pinned layer in the fourth resistor includes a component in a fourth magnetization direction opposite to the third magnetization direction;
   the first resistor and the second resistor are located so that the second magnetization of the free layer in the first resistor includes a component in the first magnetization direction and the second magnetization of the free layer in the second resistor includes a component in the second magnetization direction at a predetermined timing when the target magnetic field changes periodically;
   the third resistor and the fourth resistor are located so that the second magnetization of the free layer in the third resistor includes a component in the fourth magnetization direction and the second magnetization of the free layer in the fourth resistor includes a component in the third magnetization direction at the predetermined timing; and
   the second substrate is located at a position away from the first substrate so that a phase of a resistance of the second arm when the target magnetic field changes periodically is different from a phase of a resistance of the first arm when the target magnetic field changes periodically.

2. The magnetic sensor according to claim 1, wherein the resistance of the first arm and the resistance of the second arm change in 180° different phases with the periodic change in the target magnetic field.

3. The magnetic sensor according to claim 1, wherein:
   timing when the second magnetization of the free layer in the first resistor intersects at right angles with the first magnetization of the magnetization pinned layer in the first resistor is same as timing when the second magnetization of the free layer in the second resistor intersects at right angles with the first magnetization of the magnetization pinned layer in the second resistor; and
   timing when the second magnetization of the free layer in the third resistor intersects at right angles with the first magnetization of the magnetization pinned layer in the third resistor is same as timing when the second magnetization of the free layer in the fourth resistor intersects at right angles with the first magnetization of the magnetization pinned layer in the fourth resistor.

4. The magnetic sensor according to claim 1, wherein:
   timing when the second magnetization of the free layer in the first resistor intersects at right angles with the first magnetization of the magnetization pinned layer in the first resistor is different from timing when the second magnetization of the free layer in the second resistor intersects at right angles with the first magnetization of the magnetization pinned layer in the second resistor; and
   timing when the second magnetization of the free layer in the third resistor intersects at right angles with the first magnetization of the magnetization pinned layer in the third resistor is different from timing when the second magnetization of the free layer in the fourth resistor intersects at right angles with the first magnetization of the magnetization pinned layer in the fourth resistor.

5. The magnetic sensor according to claim 1, further comprising a second output port, wherein:
the plurality of arms further include a third arm provided on the first substrate and a fourth arm provided on the second substrate;
the third arm is provided between the ground port and the second output port in the circuit configuration;
the fourth arm is provided between the power supply port and the second output port in the circuit configuration;
the third arm includes a fifth resistor and a sixth resistor connected in series;
the fourth arm includes a seventh resistor and an eighth resistor connected in series;
the first magnetization of the magnetization pinned layer in the fifth resistor includes a component in the first magnetization direction;
the first magnetization of the magnetization pinned layer in the sixth resistor includes a component in the second magnetization direction;
the first magnetization of the magnetization pinned layer in the seventh resistor includes a component in the third magnetization direction;
the first magnetization of the magnetization pinned layer in the eighth resistor includes a component in the fourth magnetization direction;
the fifth resistor and the sixth resistor are located so that the second magnetization of the free layer in the fifth resistor includes a component in the first magnetization direction and the second magnetization of the free layer in the sixth resistor includes a component in the second magnetization direction at the predetermined timing;
the seventh resistor and the eighth resistor are located so that the second magnetization of the free layer in the seventh resistor includes a component in the fourth magnetization direction and the second magnetization of the free layer in the eighth resistor includes a component in the third magnetization direction at the predetermined timing; and
a potential at the first output port and a potential at the second output port change in respective different phases with the periodic change in the target magnetic field.

6. The magnetic sensor according to claim 5, wherein the potential at the first output port and the potential at the second output port change in 90° different phases.

7. A magnetic encoder comprising:
the magnetic sensor according to claim 1; and
a magnetic field generator that generates the target magnetic field, wherein
the magnetic sensor and the magnetic field generator are configured so that the target magnetic field changes periodically when at least one of the magnetic sensor and the magnetic field generator operates.

8. The magnetic encoder according to claim 7, wherein each of the plurality of magnetoresistive elements is configured so that a bias magnetic field is applied to the free layer.

9. The magnetic encoder according to claim 8, wherein:
a direction of the bias magnetic field at each of the plurality of magnetoresistive elements included in the first arm is a first direction intersecting with a reference direction, the reference direction being a direction having a correspondence with a direction of movement of the magnetic field generator relative to the magnetic sensor; and
a direction of the bias magnetic field at each of the plurality of magnetoresistive elements included in the second arm is a second direction intersecting with the reference direction.

10. The magnetic encoder according to claim 9, wherein:
either one of the first and second directions is a direction 90° rotated clockwise from the reference direction when viewed from above the magnetic field generator; and
the other of the first and second directions is a direction 90° rotated counterclockwise from the reference direction when viewed from above the magnetic field generator.

11. The magnetic encoder according to claim 9, wherein the first direction and the second direction are both directions 90° rotated clockwise or counterclockwise from the reference direction when viewed from above the magnetic field generator.

12. The magnetic encoder according to claim 7, wherein the magnetic field generator is a magnetic scale including M pairs of N and S poles alternately arranged around a rotation axis.

13. The magnetic encoder according to claim 12, wherein:
M is an odd number; and
the second substrate is located at a position $(180+n\times360/M)°$ rotated from the first substrate about the rotation axis, where n is an integer.

14. The magnetic encoder according to claim 12, wherein:
M is an even number; and
the second substrate is located at a position $(180+n\times360/M\pm360/(2M))°$ rotated from the first substrate about the rotation axis, where n is an integer.

15. The magnetic encoder according to claim 7, wherein the magnetic field generator is a magnetic scale including a plurality of pairs of N and S poles alternately arranged in a predetermined direction.

16. A manufacturing method for a magnetic sensor, the magnetic sensor being according to claim 1, the manufacturing method comprising:
forming the plurality of magnetoresistive elements, wherein
the forming the plurality of magnetoresistive elements includes:
forming a plurality of initial magnetoresistive elements each including an initial magnetization pinned layer to later become the magnetization pinned layer, the free layer, and the gap layer; and
fixing the first magnetization direction of the initial magnetization pinned layer by using laser light and an external magnetic field.

* * * * *